(12) United States Patent
Han et al.

(10) Patent No.: US 12,733,349 B2
(45) Date of Patent: Sep. 8, 2026

(54) DISPLAY DEVICE AND MANUFACTURING METHOD THEREOF

(71) Applicant: Samsung Display Co., Ltd., Yongin-si (KR)

(72) Inventors: Kangsoo Han, Yongin-si (KR); Kanguk Kim, Yongin-si (KR); Kwangmin Lee, Yongin-si (KR); Taehyung Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 331 days.

(21) Appl. No.: 18/479,617

(22) Filed: Oct. 2, 2023

(65) Prior Publication Data

US 2024/0244889 A1 Jul. 18, 2024

(30) Foreign Application Priority Data

Jan. 12, 2023 (KR) ........................ 10-2023-0004925

(51) Int. Cl.

| | |
|---|---|
| ***H10K 59/35*** | (2023.01) |
| ***H10K 59/12*** | (2023.01) |
| ***H10K 59/122*** | (2023.01) |
| ***H10K 59/38*** | (2023.01) |
| *H10K 102/00* | (2023.01) |

(52) U.S. Cl.

CPC ....... *H10K 59/122* (2023.02); *H10K 59/1201* (2023.02); *H10K 59/38* (2023.02); *H10K 2102/331* (2023.02)

(58) Field of Classification Search

CPC .. H10K 59/122; H10K 59/1201; H10K 59/38; H10K 2102/331; H10K 59/352; H10K 59/353; H10K 71/135

See application file for complete search history.

(56) References Cited

U.S. PATENT DOCUMENTS

| | | | |
|---|---|---|---|
| 10,541,367 B2 | 1/2020 | Takahashi | |
| 11,618,257 B2 | 4/2023 | Lee et al. | |
| 2015/0001514 A1 | 1/2015 | Goto | |
| 2017/0236882 A1* | 8/2017 | Matsunaga | H10K 59/12 257/40 |
| 2021/0359011 A1 | 11/2021 | Lee | |
| 2022/0219462 A1 | 7/2022 | Oh et al. | |
| 2023/0011658 A1 | 1/2023 | Han et al. | |
| 2023/0019886 A1 | 1/2023 | Han et al. | |
| 2024/0251625 A1* | 7/2024 | Meng | H10K 59/353 |

FOREIGN PATENT DOCUMENTS

| | | |
|---|---|---|
| CN | 108010934 A | 5/2018 |
| CN | 108807458 A | 11/2018 |
| KR | 10-2021-0142038 A | 11/2021 |
| WO | WO 2015-155953 A1 | 10/2015 |

* cited by examiner

*Primary Examiner* — Donald L Raleigh

(74) *Attorney, Agent, or Firm* — Womble Bond Dickinson (US) LLP

(57) ABSTRACT

A display device including a plurality of pixels and configured to display images, wherein the plurality of pixels comprise a first pixel row and a second pixel row adjacent to each other along a first direction, a first pixel, comprising a first group of a first plurality of subpixels, is repeatedly arranged along the first pixel row in a second direction perpendicular to the first direction, the second pixel row is shifted by a first distance in the second direction from the first pixel row, and the first distance is less than or equal to half a size of any one of the plurality of sub pixels in the second direction.

20 Claims, 11 Drawing Sheets

FIG. 6

DISPLAY DEVICE AND MANUFACTURING METHOD THEREOF

CROSS-REFERENCE TO RELATED APPLICATION

The present application claims priority to and the benefit of Korean Patent Application No. 10-2023-0004925, filed on Jan. 12, 2023, in the Korean Intellectual Property Office, the entire disclosure of which is incorporated herein by reference.

BACKGROUND

1. Field

Aspects of one or more embodiments relate to a display device and a method of manufacturing the display device.

2. Description of the Related Art

Display devices are devices configured to visually display data. A display device may include a substrate divided into a display area and a peripheral area. The display area may include scan lines and a data lines insulated from each other and a plurality of pixels. In addition, the display area may include, to correspond to each of the plurality of pixels, one or more thin-film transistors and a subpixel electrode electrically connected to the one or more thin-film transistors. In addition, a counter electrode, which is commonly provided in the plurality of pixels, may be provided in the display area. Various wirings configured to deliver electric signals to the display areas, a scan driver, a data driver, a controller, a pad portion, and the like may be provided in the peripheral area.

The various uses of such display devices have expanded over time. Accordingly, various designs have been proposed to improve quality of display devices.

The above information disclosed in this Background section is only for enhancement of understanding of the background and therefore the information discussed in this Background section does not necessarily constitute prior art.

SUMMARY

Aspects of one or more embodiments include a display device, by which a resolution may be relatively improved, and relatively high-quality images may be implemented, and a method of manufacturing the display device. However, this is only an example, and the scope of the embodiments according to the present disclosure is not limited thereto.

Additional aspects will be set forth in part in the description which follows and, in part, will be more apparent from the description, or may be learned by practice of the presented embodiments of the disclosure.

According to some embodiments of the present disclosure, a display device includes a plurality of pixels and is configured to implement images, wherein the plurality of pixels include a first pixel row and a second pixel row adjacent to each other in a first direction, a first pixel, which is provided as a group of a plurality of subpixels, is repeatedly arranged in the first pixel row in a second direction perpendicular to the first direction, the second pixel row is shifted by a first distance in the second direction from the first pixel row, and the first distance is smaller than or equal to half a size of any one of the plurality of subpixels in the second direction.

According to some embodiments, a second pixels, which is provided as a group of a plurality of subpixels, may be repeatedly arranged in the second pixel in the second pixel row, and an arrangement of the plurality of subpixels provided in the first pixel may be identical to an arrangement of the plurality of subpixels provided in the second pixel.

According to some embodiments, a 1-1 subpixel configured to emit a first color among the plurality of subpixels provided in the first pixel may partially overlaps in the first direction, a 2-1 subpixel configured to emit the first color among the plurality of subpixels provided in the second pixel.

According to some embodiments, the 2-1 subpixel may be shifted by the first distance in the second direction from the 1-1 subpixel.

According to some embodiments, the plurality of subpixels may include n pixel rows (where n is a natural number equal to or greater than 2) including the first pixel row and the second pixel row and arranged in the first direction, and each of the n pixel rows may be shifted by integer times the first distance in the second direction from the first pixel row.

According to some embodiments, the n pixel rows may be repeatedly arranged in the first direction.

According to some embodiments, even-numbered pixel rows among the n pixel rows may be shifted by the first distance in the second direction from odd-numbered pixel rows.

According to some embodiments, the display panel may include an emission panel and a color panel, and the color panel may include a bank, in which openings corresponding to emission areas of the plurality of pixels are provided, and quantum dot layers filling the openings of the bank.

According to some embodiments, the emission panel may include a pixel electrode, a pixel defining film in which openings exposing a portion of the pixel electrode and corresponding to the emission areas of the plurality of pixels are provided, and an emission layer filling the openings of the pixel defining film.

According to some embodiments of the present disclosure, in a method of manufacturing a display device including an emission panel and a color panel, a method of forming the color panel may include forming a bank, in which an opening is formed, in a certain pixel arrangement on a substrate, providing droplets onto the substrate on which the bank is formed, and the pixel arrangement may include a first pixel row and a second pixel row adjacent to each other in a first direction, wherein a first pixel, which is provided as a group of a first plurality of subpixels may be repeatedly arranged in the first pixel row in a second direction perpendicular to the first direction, the second pixel row may be shifted by a first distance in the second direction from the first pixel row, and the first distance is smaller than or equal to half a size of any one of the plurality of subpixels in the second direction.

According to some embodiments, a second pixel, which is provided as a group of a plurality of subpixels, may be repeatedly arranged in the second direction in the second pixel row, and an arrangement of the plurality of subpixels provided in the first pixel may be identical to an arrangement of the plurality of subpixels provided in the second pixel.

According to some embodiments, a 1-1 subpixel configured to emit a first color among the plurality of subpixels provided in the first pixel may partially, in the first direction, a 2-1 subpixel configured to emit the first color among the plurality of subpixels provided in the second subpixel.

According to some embodiments, the 2-1 subpixel may be shifted by the first distance in the second direction from the 1-1 subpixel.

According to some embodiments, the providing of the droplets onto the substrate on which the bank is formed may include discharging the droplets into the opening of the bank according to the pixel arrangement through a plurality of nozzles while moving the substrate in the first direction.

According to some embodiments, the first distance may be integer times a distance among the plurality of nozzles.

According to some embodiments, among the plurality of nozzles, nozzles configured to discharge the droplets to the 1-1 subpixel may be at least partially different from nozzles configured to discharge the droplets to the 2-1 subpixel.

According to some embodiments, the pixel arrangement may include n pixel rows (where n is a natural number equal to or greater than 2) including the first pixel row and the second pixel row and arranged in the first direction, and each of the n pixel rows may be shifted by integer times the first distance in the second direction from the first pixel row.

According to some embodiments, in the pixel arrangement, the n pixel rows may be repeatedly arranged in the first direction.

According to some embodiments, in the pixel arrangement, even-numbered pixel rows among the n pixel rows may be shifted by the first distance in the second direction from odd-numbered pixel rows.

According to some embodiments, the method may further include arranging the color panel on the emission panel.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 6 is a cross-sectional view schematically illustrating a display device according to some embodiments;

DETAILED DESCRIPTION

Figure 1:
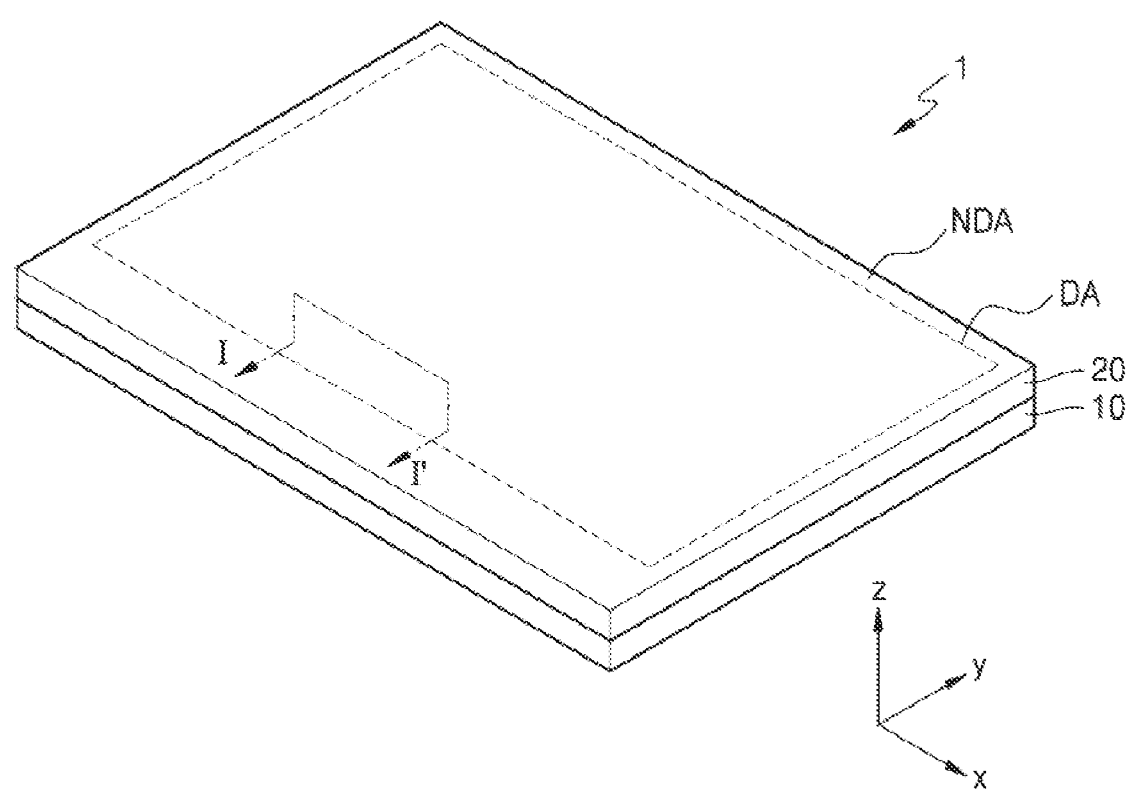
FIG. 1 is a perspective view schematically illustrating a display device according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As used herein, terms such as "first," "second" are used to distinguish one component from another, but not in a limited sense.

As used herein, unless obviously defined otherwise, singular forms also include plural forms.

As used herein, terms such as "include" or "comprise" indicate existence of features or components written in the specification, and do not preclude possibility of one or more additional features or components.

As used herein, when a portion such as a film, an area, or a component is on or above another portion, the portion may be directly on the other portion, and other films, areas, or components may be located therebetween.

In the present specification, when it is referred that a film, an area, and a component are connected to another film, area, and component, the film, area, and component may be directly connected to the other film, area, and component, or may be indirectly connected with another film, area, and component therebetween. For example, when it is referred that a film, an area, and a component are electrically connected to another film, area, and component, the film, area, and component may be directly in electric connection with the other film, area, and component, or may be indirectly in electric connection with the other film, area, and component with another film, area, and component therebetween.

In the present specification, "A and/or B" indicates A, B, or A and B. "At least one of A and B" indicates A, B, or A and B.

As used herein, x axis, y axis, and z axis are not limited to three axes on an orthogonal coordinate system and may be interpreted as a broader sense. For example, x axis, y axis, and z axis may be orthogonal to one another, but may also refer to different directions not orthogonal to one another.

In the present specification, when a certain embodiment may be implemented differently, a specific process order may be performed differently from the described order. For example, two consecutively described processes may be performed substantially at the same time or performed in an order opposite to the described order.

For convenience of explanation, sizes of components in the drawings may be exaggerated. For example, as sizes and thicknesses are arbitrarily shown for convenience of explanation, the embodiments are not limited to the accompanying drawings.

Figure 2:
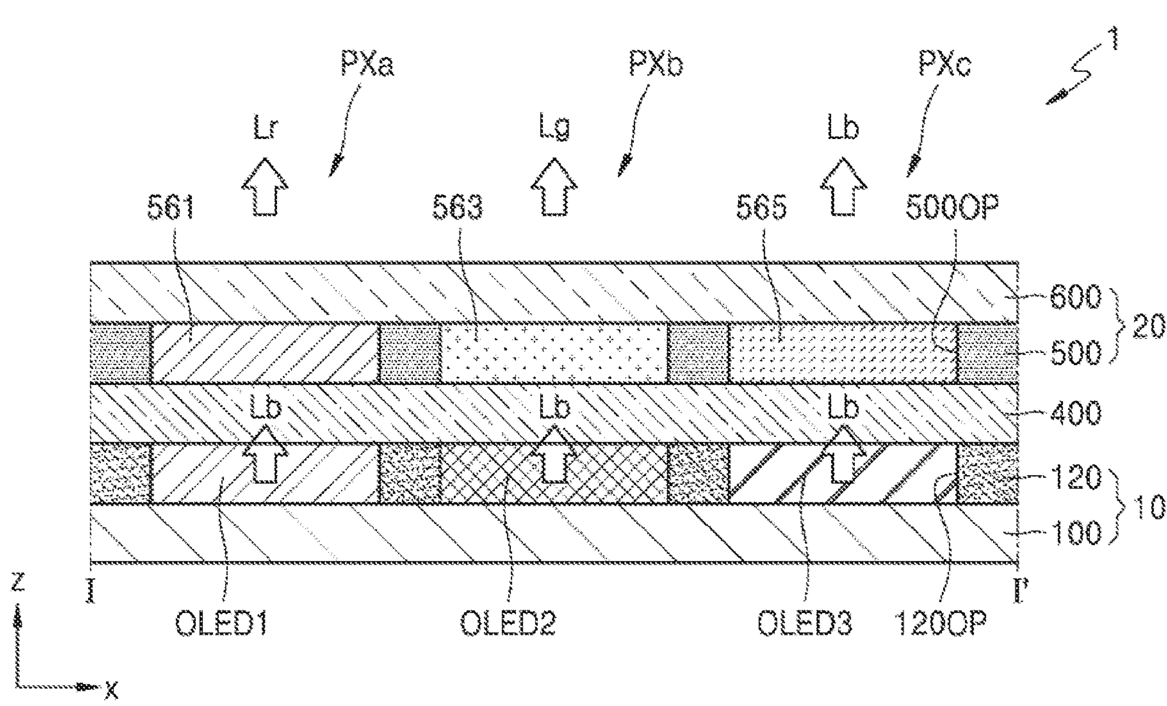
FIG. 2 is a cross-sectional view schematically illustrating a display device according to some embodiments.
Figure 3:
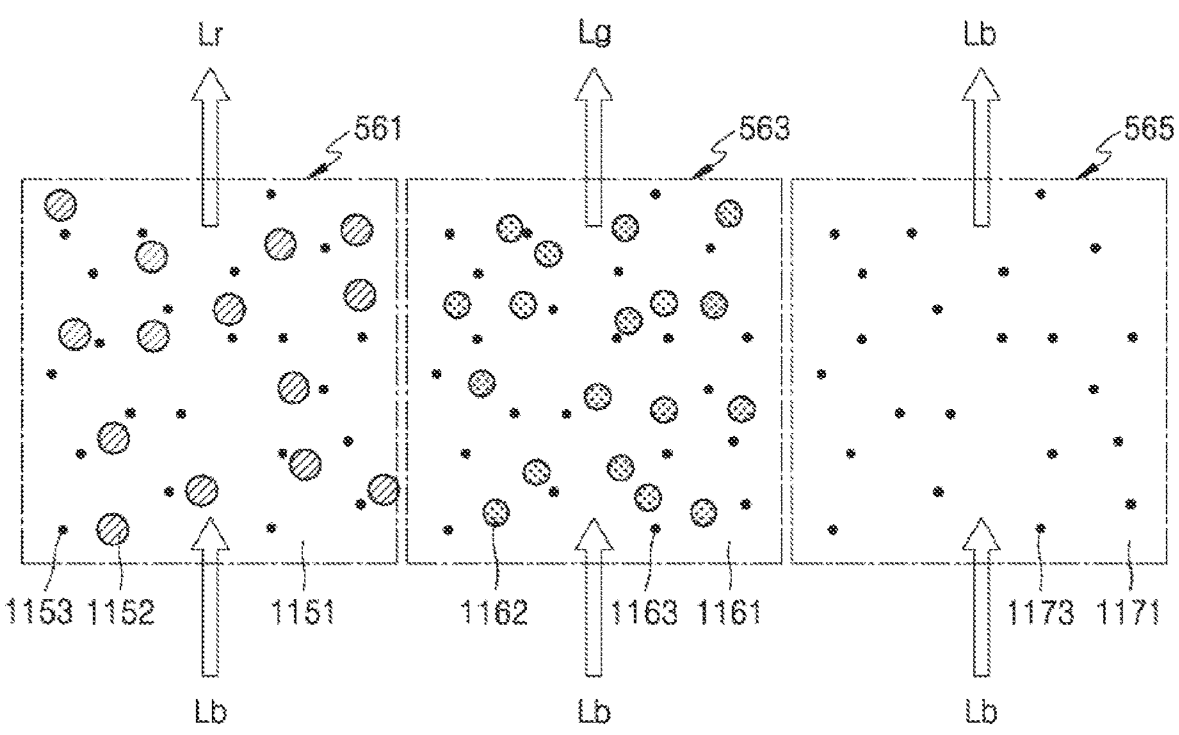
FIG. 3 is a cross-sectional view schematically illustrating a first quantum-dot layer, a second quantum-dot layer, and a light-transmitting layer shown in FIG. 2.

FIG. 1 is a perspective view schematically illustrating aspects of a display device 1 according to some embodiments; FIG. 2 is a cross-sectional view schematically illustrating aspects of the display device 1 according to some embodiments; and FIG. 3 is a cross-sectional view schematically illustrating aspects of a first quantum-dot layer, a second quantum-dot layer, and a light-transmitting layer shown in FIG. 3. FIG. 2 corresponds to a cross-sectional view taken along line I-I' shown in FIG. 2.

Referring to FIG. 1, the display device 1 may include a display area DA and a non-display area NDA surrounding (e.g., in a periphery or outside a footprint of) the display area DA. The display device 1 may provide or display images through an array of a plurality of pixels two-dimensionally arranged in the display area DA.

Each pixel in the display device 1 includes an area in which light having certain colors may be emitted, and the display device 1 may provide or display images using light emitted from the pixels. Each pixel may include a plurality of subpixels. Each of the plurality of subpixels may emit red, green, or blue light.

The non-display area NDA, which is an area that does not provide or display images, may entirely surround (e.g., in a periphery or outside a footprint of) the display area DA. A driver or main power line configured to provide electrical signals or power to pixel circuits may be arranged in the non-display area NDA. The non-display area NDA may include a pad, i.e., an area to which electronic devices or a printed circuit board may be electrically connected.

As shown in FIG. 1, the display area DA may have a polygon shape including a square. For example, the display area DA may have a rectangular shape in which a horizontal length is greater than a vertical length, a rectangle in which a horizontal length is less than a vertical length, or a square shape. Alternatively, the display area DA may have various shapes, e.g., an oval or a circle.

According to some embodiments, the display device 1 may include a light-emitting panel 10 and a color panel 20 stacked in a thickness direction (e.g., a z direction). Referring to FIG. 2, the light-emitting panel 10 may include a first light-emitting device OLED1, a second light-emitting device OLED2, and a third light-emitting device OLED3 on a lower substrate 100. Here, the first light-emitting device OLED1, the second light-emitting device OLED2, and the third light-emitting device OLED3 may include organic light-emitting diodes.

Light (e.g., blue light Lb) emitted from the first light-emitting device OLED1, the second light-emitting device OLED2, and the third light-emitting device OLED3 may be converted into red light Lr, green light Lg, or blue light Lb or transmitted while passing through the color panel 20.

According to some embodiments, a pixel defining film 120 defining an emission area of each of the first light-emitting device OLED1, the second light-emitting device OLED2, and the third light-emitting device OLED3 may be located on the lower substrate 100. That is, the pixel defining film 120 may include an opening 120OP corresponding to the emission area of each of the first light-emitting device OLED1, the second light-emitting device OLED2, and the third light-emitting device OLED3.

According to some embodiments, the pixel defining film 120 may include an organic insulating material. Alternatively, the pixel defining film 120 may include an inorganic insulating material, such as silicon nitride ($SiN_x$), silicon oxynitride ($SiO_xN_y$), or silicon oxide ($SiO_x$). Alternatively, the pixel defining film 120 may include an organic insulating material and an inorganic insulating material. According to some embodiments, the pixel defining film 120 may include a black film including a light-shielding material. The light-shielding material may include carbon black, a carbon nanotube, a resin or paste including a black dye, metal particles (e.g., nickel, aluminum, molybdenum, and alloys thereof), metal oxide particles (e.g., chromium oxide), or metal nitride particles (e.g., chromium nitride). When the pixel defining film 120 includes a light-shielding material, reflection of external light due to metal structures located under the pixel defining film 120 may be relatively reduced.

According to some embodiments, a spacer may be on the pixel defining film 120. The spacer may include an organic insulating material such as polyimide. Alternatively, the spacer may include an inorganic insulating material such as $SiN_x$ or $SiO_x$, or may include an organic insulating material and an inorganic insulating material.

According to some embodiments, the spacer may include a material identical to a material of the pixel defining film 120. In this case, the pixel defining film 120 and the spacer may be formed together in a mask process using a halftone mask and the like. According to some embodiments, the spacer and the pixel defining film 120 may respectively include different materials.

According to some embodiments, a filler 400 may be between the lower substrate 100 and an upper substrate 600. The filler 400 may have a buffering function against foreign pressure and the like. The filler 400 may include an organic material, such as methyl silicon, phenyl silicon, polyimide, and the like. However, the filler 400 is not limited thereto and may also include an organic sealant, e.g., a urethane-based resin, an epoxy-based resin, an acryl-based resin, or silicon that is an inorganic sealant.

According to some embodiments, a bank 500 may be located on the filler 400. The bank 500 may include various materials capable of absorbing light. The bank 500 may include a material identical to or different from the material of the pixel defining film 120. For example, the bank 500 may include an opaque inorganic insulating material, such as chromium oxide or molybdenum oxide, or an opaque organic insulating material such as a black resin.

According to some embodiments, the bank 500 may include openings 500OP respectively corresponding to emission areas of the first light-emitting diode OLED1, the second light-emitting diode OLED2, and the third light-emitting diode OLED3. For example, the opening 500OP defined in the bank 500 may correspond to the openings 120OP defined in the pixel defining film 120. According to some embodiments, a first quantum-dot layer 561, a second quantum-dot layer 563, and a light-transmitting layer 565 may be respectively in the openings 500OP defined in the bank 500.

Referring to FIGS. 2 and 3, the first quantum-dot layer 561 may convert incident blue light Lb into red light Lr. The first quantum-dot layer 561 may include first quantum dots 1152, first scatterers 1153, and a first photosensitive polymer 1151. The first quantum dots 1152 and the first scatterers 1153 may be scattered in the first photosensitive polymer 1151.

The first quantum dots 1152 may be excited by the blue light Lb and isotropically emit red light Lr having a wavelength longer than a wavelength of the blue light Lb. The first photosensitive polymer 1151 may include an organic material having transmittance. The first scatterers 1153 may improve color conversion efficiency by scattering the blue light Lb, which has not been absorbed by the first quantum dots 1152, to have a greater number of first quantum dots 1152 excited. The first scatterers 1153 may include, for example, titanium oxide ($TiO_2$) or metal particles. The first quantum dots 1152 may be selected from among a Group II-VI compound, a Group III-V compound, a Group IV-VI compound, a Group IV element, a Group IV compound, and combinations thereof.

According to some embodiments, the first quantum-dot layer 561 may convert light in a third wavelength band to light in a first wavelength band. For example, when the first light-emitting device OLED1 generates light having a wavelength from 450 nm to 495 nm, the first quantum-dot layer 561 may convert the light into light having a wavelength from 630 nm to 780 nm. Accordingly, by a first subpixel PXa, light having a wavelength from 630 nm to 780 nm may be emitted outward through the upper substrate 600.

According to some embodiments, the second quantum-dot layer 563 may include second quantum dots 1162, second scatterers 1163, and a second photosensitive polymer 1161. The second quantum dots 1162 and the second scatterers 1163 may be scattered in the second photosensitive polymer 1161. The second quantum dots 1162 may be excited by the blue light Lb and isotropically emit green light Lb having a wavelength longer than the wavelength of the blue light Lb. The second photosensitive polymer 1161 may include an organic material having transmittance. The second scatterers 1163 may enhance color conversion efficiency by scattering blue light Lb, which has not been absorbed by the second quantum dots 1162, to have a greater number of second quantum dots 1162 excited. The second scatterers 1163 may include, for example, $TiO_2$ or metal particles. The second quantum dots 1162 may be selected from among a Group II-IV compound, a Group III-V compound, a Group IV-VI compound, a Group IV element, a Group IV compound, and combinations thereof. In some embodiments, the second quantum dots 1162 may include a material identical to the material of the first quantum dots 1152, and in this case, a size of the second quantum dots 1162 may be smaller than a size of the first quantum dots 1152.

According to some embodiments, the second quantum-dot layer 563 may convert light in the third wavelength band to light in the first wavelength band. For example, when the second light-emitting device OLED2 generates light having a wavelength from 450 nm 495 nm, the second quantum-dot layer 563 may convert the light into light having a wavelength from 495 nm to 570 nm. Accordingly, by a second subpixel PXb, light having the wavelength from 495 nm to 570 nm may be emitted outward through the upper substrate 600.

The blue light Lb may be transmitted through the light-transmitting layer 565. The light-transmitting layer 565 may include third scatterers 1173 and a third photosensitive polymer 1171. The third scatterers 1173 may be scattered in the third photosensitive polymer 1171. The third photosensitive polymer 1171 may include, for example, an organic material having light transmittance, e.g., a silicon resin or an epoxy resin, and may include a material identical to the material included in the first photosensitive polymer 1151 or the second photosensitive polymer 1161. The third scatterers 1173 may be emitted by scattering the blue light Lb, and may include a material identical to the material included in the first scatterers 1153 and second scatterers 1163 described above.

According to some embodiments, the first quantum-dot layer 561, the second quantum-dot layer 563, and the light-transmitting layer 565 may be respectively formed in the openings 500OP of the bank 500 through an inkjet printing method.

According to some embodiments, the upper substrate 600 may be located on the first quantum-dot layer 561, the second quantum-dot layer 563, and the light-transmitting layer 565. A first color filter layer 581 (see FIG. 6) may be located between the first quantum-dot layer 561 and the upper substrate 600, a second color filter layer 583 (see FIG. 6) may be located between the second quantum-dot layer 563 and the upper substrate 600, and a third color filter layer 585 (see FIG. 6) may be located between the light-transmitting layer 565 and the upper substrate 600. Further details thereof are described below with reference to FIG. 6.

The lower substrate 100 and the upper substrate 600 may each include glass, metal, or a polymer resin. When the lower substrate 100 and the upper substrate 600 are flexible or bendable, the lower substrate 100 and the upper substrate 600 may each include a polymer resin, such as polyether sulfone, polyacrylate, polyetherimide, polyethylene naphthalate, polyethylene terephthalate, polyphenylene sulfide, polyarylate, polyimide, polycarbonate, or cellulose acetate propionate. The lower substrate 100 and the upper substrate 600 may be variously modified, for example, may have a multiple-layer structure including two layers including the aforementioned polymer materials and a barrier layer therebetween, the barrier layer including an inorganic material, e.g., silicon nitride ($SiN_x$), silicon oxynitride ($SiO_xN_y$), silicon oxide ($SiO_x$), and the like.

According to some embodiments, the display device 1 may be formed through a process including: forming the first light-emitting device OLED1, the second light-emitting device OLED2, and the third light-emitting device OLED3 on the lower substrate 100, forming the first quantum-dot layer 561, the second quantum-dot layer 563, and the light-transmitting layer 565 on the upper substrate 600, and bonding the lower substrate 100, on which the first light-emitting device OLED1, the second light-emitting device OLED2, and the third light-emitting device OLED3 are formed, to the upper substrate 600 on which the first quantum-dot layer 561, the second quantum-dot layer 563, and the light-transmitting layer 565 are formed.

Figure 4:
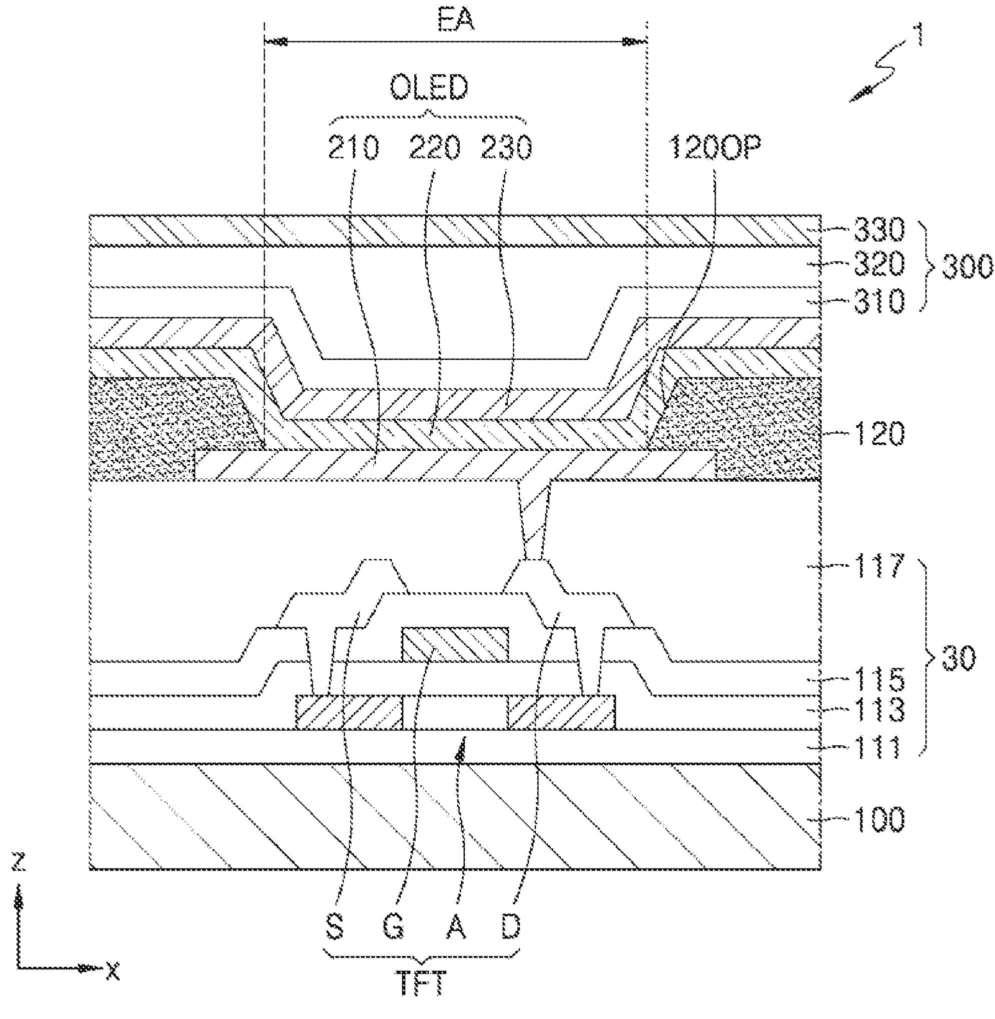
FIG. 4 is a cross-sectional view schematically illustrating a display device according to some embodiments.

FIG. 4 is a cross-sectional view schematically illustrating a display device according to some embodiments.

Referring to FIG. 4, a thin-film transistor TFT, a light-emitting device OLED, and a thin-film encapsulation layer 300 may be located on the lower substrate 100. A buffer layer 111 may be located on the lower substrate 100. The buffer layer 111 may include an organic material, such as SiN, $SiO_xN_y$, and $SiO_x$. The buffer layer 111 may be located on the lower substrate 100 to enhance smoothness of a top surface of the lower substrate 100 or prevent, reduce, or minimize permeation of impurities or contaminants from the lower substrate 100 and the like to a semiconductor layer A of the thin-film transistor TFT.

The thin-film transistor TFT may be located on the buffer layer 111. The thin-film transistor TFT may include a semiconductor layer A, a gate electrode G, a source electrode S, and a drain electrode D. The semiconductor layer A may be located on the buffer layer 111. The semiconductor layer A may include amorphous silicon, polycrystalline silicon, an organic semiconductor material, or an oxide semiconductor material.

A first insulating layer 113 may be located on the semiconductor layer A. The first insulating layer 113 may include an inorganic material such as SiN, $SiO_xN_y$, and $SiO_x$, and may include a single layer or multiple layers including the aforementioned materials. The first insulating layer 113 may be between the semiconductor layer A and the gate electrode G and secure insulation of the semiconductor layer A and the gate electrode G.

The gate electrode G may be located on the first insulating layer 113. The gate electrode G may include a low-resistance conductive material such as molybdenum (Mo), aluminum (Al), copper (Cu), and/or titanium (Ti), and may include a single layer or multiple layers including the aforementioned materials.

A second insulating layer 115 may be located on the gate electrode G. The second insulating layer 115 may include an inorganic material, such as $SiN_x$, $SiO_xN_y$, and $SiO_x$, and may include a single layer or multiple layers including the aforementioned materials.

The source electrode S and the drain electrode D may be located on the second insulating layer 115. The source electrode S and the drain electrode D may include at least one material selected from among a group including Cu, Ti, and Al. For example, the source electrode S and the drain electrode D may each have a three-layer structure including a titanium layer, an aluminum layer, and a titanium layer.

A planarization layer 117 may be located on the source electrode S and the drain electrode D. The planarization layer 117 may include a single polyimide-based resin layer. However, the embodiments according to the present disclosure are not limited thereto. Alternatively, the planarization layer 117 may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin.

The light-emitting device OLED may be located on the planarization layer 117. The light-emitting device OLED may include a pixel electrode 210, an intermediate layer 220, and a counter electrode 230. The pixel electrode 210 may be located on the planarization layer 117. The pixel electrode 210 may be electrically connected to the source electrode S and/or the drain electrode D through a via hole defined in the planarization layer 117. Accordingly, the light-emitting device OLED may be electrically connected to the thin-film transistor TFT.

The pixel electrode 210 may include a conductive oxide material, such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or combinations thereof. According to some embodiments, the pixel electrode 210 may further include a film including ITO, IZO, ZnO, or $In_2O_3$ under/above the aforementioned reflective film. For example, the pixel electrode 210 may include a multiple-layer structure including ITO/Ag/ITO.

The pixel defining film 120 may be located on the pixel electrode 210. The pixel defining film 120 has an opening 120OP exposing at least a portion of the pixel electrode 210. The opening 120OP defined in the pixel defining film 120 may define an emission area EA of light emitted from the light-emitting device OLED. For example, a width of the opening 120OP defined in the pixel defining film 120 may correspond to a width of the emission area EA. A peripheral area of the emission area EA is a non-emission area, which may surround the emission area EA.

The intermediate layer 220 including an emission layer may be located on the pixel electrode 210. The intermediate layer 220 may include a low-molecular weight material or a high-molecular weight material. When the intermediate layer 220 includes a low-molecular weight material, the intermediate layer 220 may include a structure in which a hole injection layer (HIL), a hole transport layer (HTL), an emission layer (EML), an electron transport layer (ETL), an electron injection layer (EIL), and the like are stacked in a single or a complex structure, and may be formed through a vacuum deposition method. When the intermediate layer 220 includes a high-molecular weight material, the intermediate layer 220 may include a structure including an HTL and an EML. In this case, the HTL may include PEDOT, and the EML may include a high-molecular weight material such as a poly-phenylenevinylene (PPV)-based material, a polyfluorene-based material, and the like. The intermediate layer 220 is not limited thereto and may have various structures. The intermediate layer 220 may be formed through a screen-printing method, an inkjet printing method, a deposition method, a laser-induced thermal imaging (LITI) method, or the like.

According to some embodiments, the intermediate layer 220 may include the emission layer, which may emit light in a third wavelength band. For example, the emission layer may emit light having a wavelength from 450 nm to 495 nm. The emission layer may be integrally formed to entirely cover the lower substrate 100. However, the embodiments according to the present disclosure are not limited thereto. The emission layer may be patterned for each pixel to correspond to the opening 120OP of the pixel defining film 120. According to some embodiments, the emission layer may be formed in the opening 120OP of the pixel defining film 120 through an inkjet printing method.

The counter electrode 230 may be located on the intermediate layer 220. The counter electrode 230 may include a conductive material having a small work function. For example, the counter electrode 230 may include a (semi) transparent layer including Ag, mg, Al, Pt, Pd, Au, Ni, Nd, Ir, Cr, Li, Ca, or alloys thereof. Alternatively, the counter electrode 230 may further include a layer including ITO, IZO, ZnO, or $In_2O_3$ on the (semi) transparent layer including the aforementioned materials.

According to some embodiments, a capping layer may be further located on the counter electrode 230. The capping layer may include lithium fluoride (LiF), an inorganic material, or/and an organic material.

The light-emitting device may be easily damaged due to foreign moisture or oxygen, and therefore, according to needs, an encapsulation layer may cover and protect the light-emitting device. The encapsulation layer may be provided as the thin-film encapsulation layer 300 including at least one inorganic film layer and at least one organic film layer. Here, the thin-film encapsulation layer 300 may include a first inorganic film layer 310, an organic film layer 320, and a second inorganic film layer 330 that are sequentially stacked.

The first inorganic film layer 310 may be directly located on the counter electrode 230. The first inorganic film layer 310 may prevent, reduce, or minimize permeation of foreign contaminants, moisture or oxide into the light-emitting device OLED.

The organic film layer 320 may be directly located on the first inorganic film layer 310. The organic film layer 320 may provide a flat surface on the first inorganic film layer 310. As curves or particles formed on a top surface of the first inorganic film layer 310 are covered by the organic film layer 320, impacts of a superficial state of the top surface of the first inorganic film layer 310 on components on the organic film layer 320 may be prevented or reduced.

The second inorganic film layer 330 may be directly located on the organic film layer 320. The second inorganic film layer 330 may prevent, reduce, or minimize leakage of contaminants or moisture and the like discharged from the organic film layer 320.

The first inorganic film layer 310 and the second inorganic film layer 330 may include silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), zinc oxide ($ZnO_2$), or the like. Here, ZnO may include zinc oxide (ZnO) and/or zinc peroxide ($ZnO_2$), and the first inorganic film layer 310 and the second inorganic film layer 330 may include a single layer or multiple layers including the aforementioned materials. The organic film layer 320 may include a polymer-based material. The polymer-based material may include an acryl-based resin, an epoxy-based resin, polyimide, polyethylene, and the like. According to some embodiments, the organic film layer 320 may include acrylate.

According to some embodiments, components located between the lower substrate 100 and the pixel defining film 120 may be collectively named as an insulating layer 30.

Figure 5:
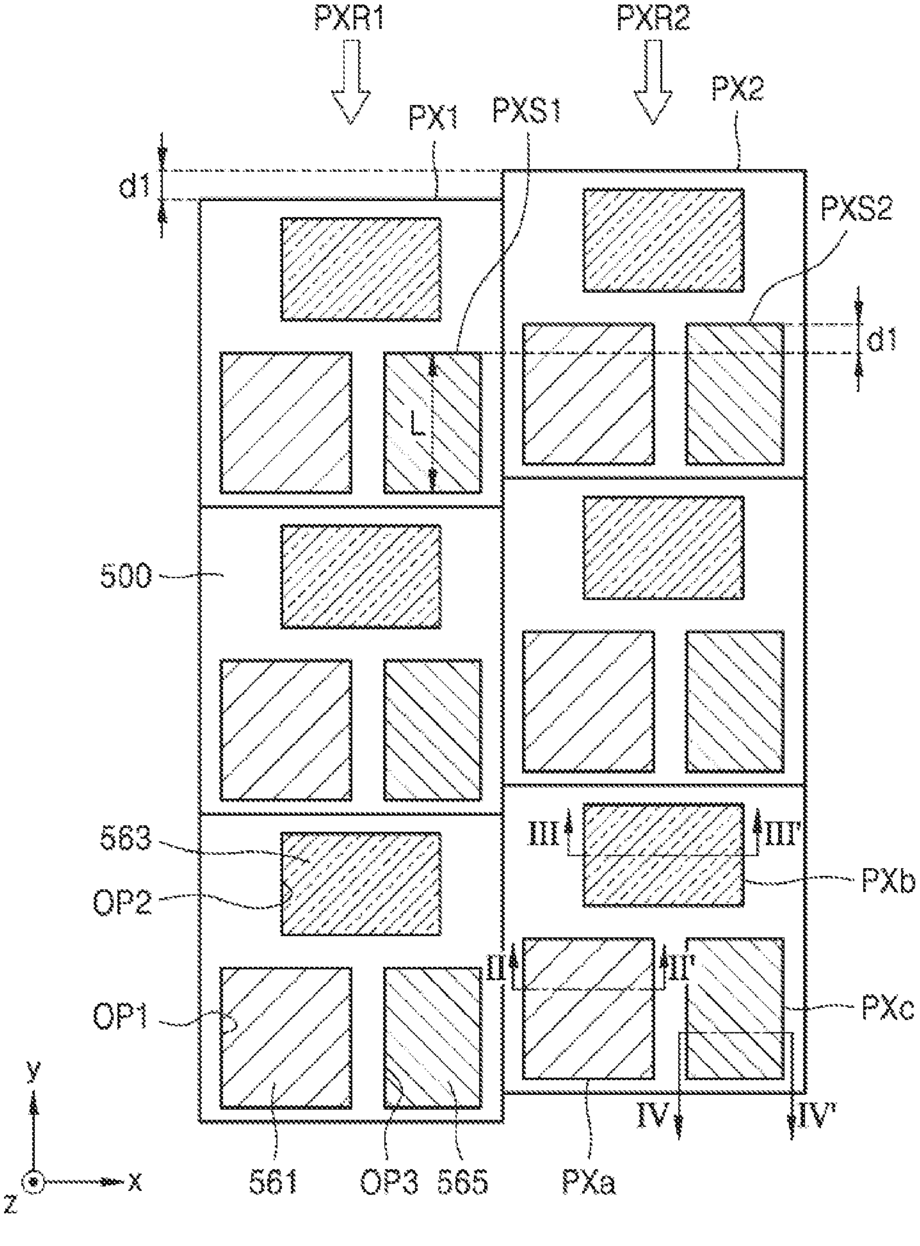
FIG. 5 is a cross-sectional view schematically illustrating a display device according to some embodiments.
Figure 6:
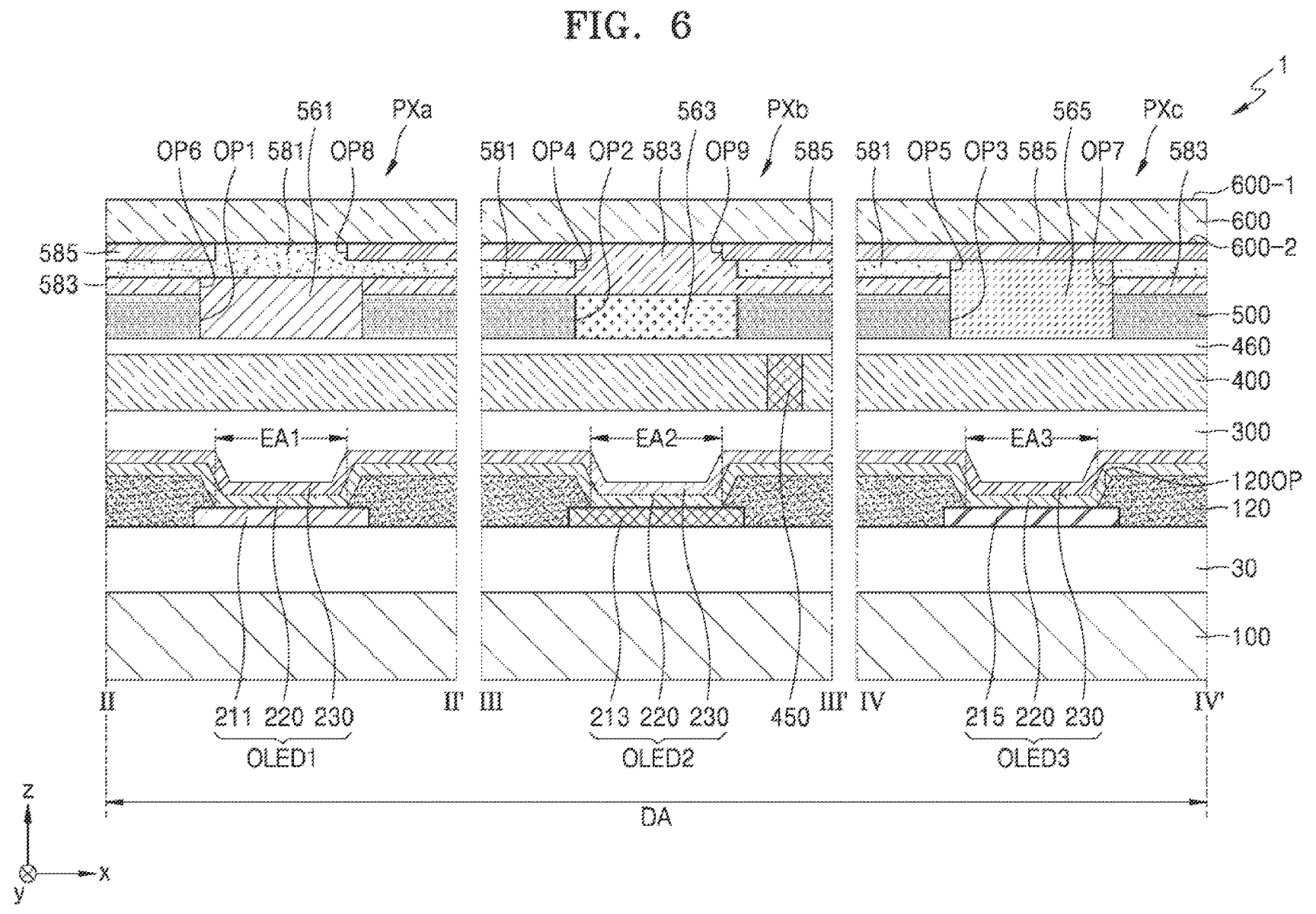

FIG. 5 is a top-plan view schematically illustrating a portion of the display device 1 according to some embodiments, and FIG. 6 is a cross-sectional view taken along the line II-II', line III-III', and line IV-IV' shown in FIG. 5.

Referring to FIGS. 5 and 6, the insulating layer 30 may be located on the lower substrate 100. As described above with reference to FIG. 4, the insulating layer 30 may include the buffer layer 111, the first insulating layer 113, the second insulating layer 115, and the planarization layer 117, and the thin-film transistor TFT among the components included in the insulating layer 30.

A first pixel electrode 211, a second pixel electrode 213, and a third pixel electrode 215 may each be located on the insulating layer 30. The pixel defining film 120 may be located on the first pixel electrode 211, the second pixel electrode 213, and the third pixel electrode 215, and the pixel defining film 120 may include the opening 120OP at least partially exposing the first pixel electrode 211, the second pixel electrode 213, and the third pixel electrode 215. Emission areas (i.e., a first emission area EA1, a second emission area EA2, and a third emission area EA3) of the subpixels (i.e., the first subpixel PXa, the second subpixel PXb, a third subpixel PXc) may be defined by the openings 120OP defined in the pixel defining film 120.

The first light-emitting device OLED1 may have the first emission area EA1, and the first emission area EA1 of the first light-emitting device OLED1 may be defined by the opening 120OP of the pixel defining film 120. Here, the first emission area EA1 may correspond to an emission area of light emitted from the first light-emitting device OLED1.

The second light-emitting device OLED2 may have the second emission area EA2, and the second emission area EA2 of the second light-emitting device OLED2 may be defined by the opening 120OP of the pixel defining film 120. Here, the second emission area EA2 may correspond to an emission area of light emitted from the second light-emitting device OLED2.

The third light-emitting device OLED3 may have the third emission area EA3, and the third emission area EA3 of the third light-emitting diode OLED3 may be defined by the opening 120OP of the pixel defining film 120. Here, the third emission area EA3 may correspond to an emission area of light emitted from the third light-emitting device OLED3.

In addition, the pixel defining film 120 may prevent or reduce arcs and the like generated at edges of the first pixel electrode 211 to the third pixel electrode 215 by increasing a distance between the edge of the first pixel electrode 211 and the counter electrode 230, a distance between the edge of the second pixel electrode 213 and the counter electrode 230, and the edge of the third pixel electrode 215 and the counter electrode 230.

The intermediate layer 220 may be located on the first pixel electrode 211 to the third pixel electrode 215, and the counter electrode 230 may be located on the intermediate layer 220. The intermediate layer 220 may be provided as a layer that is integrally formed over the first pixel electrode 211 to the third pixel electrode 215. However, the embodiments are not limited thereto. The intermediate layer 220 may be patterned in each of the first pixel electrode 211, the second pixel electrode 213, and the third pixel electrode 215.

The thin-film encapsulation layer 300 may be located on the first light-emitting device OLED1 to the third light-emitting device OLED3. As described above with reference to FIG. 4, the thin-film encapsulation layer 300 may be provided as a structure in which the first inorganic film layer 310, the organic film layer 320, and the second inorganic film layer 330 are sequentially stacked.

The upper substrate 600 may be above the lower substrate 100, such that the first light-emitting device OLED1 including the first pixel electrode 211, the second light-emitting device OLED2 including the second pixel electrode 213, and the third light-emitting device OLED3 including the third pixel electrode 215 may be between the upper substrate 600 and the lower substrate 100. The upper substrate 600 may include a polymer material. The upper substrate 600 may include, for example, a polymer resin, such as polyether sulfone, polyacrylate, polyetherimide, polyethylene naphthalate, polyethylene terephthalate, polyphenylene sulfide, polyarylate, polyimide, polycarbonate, or cellulose acetate propionate. The upper substrate 600 may be variously modified, for example, may have a multiple-layer structure including two layers including the aforementioned polymer materials and a barrier layer therebetween, the barrier layer including an inorganic material, e.g., $SiN_x$, $SiO_xN_y$, $SiO_x$, and the like. The upper substrate 600 may be flexible or bendable.

According to some embodiments, the upper substrate 600 may include a top surface 600-1 and a bottom surface 600-2. Here, the bottom surface 600-2 may indicate a surface closer to the lower substrate 100 than the top surface 600-1 is.

According to some embodiments, the bank 500 may be located between the lower substrate 100 and the upper substrate 600. The bank 500 may include various materials capable of absorbing light. The bank 500 may include a first opening OP1, a second opening OP2, and a third opening OP3 respectively corresponding to the emission areas (i.e., the first emission area EA1, the second emission area EA2, and the third emission area EA3) of the light-emitting devices (i.e., the first light-emitting device OLED1, the second light-emitting device OLED2, and the third light-emitting device OLED3). More particularly, the first opening OP1 corresponding to the first emission area EA1 of the first light-emitting device OLED1, the second opening OP2 corresponding to the second emission area EA2 corresponding to the second light-emitting device OLED2, and the third opening OP3 corresponding to the third emission area EA3 of the third light-emitting device OLED3 may be defined in the bank 500 arranged in the display area DA.

According to some embodiments, the first opening OP1, the second opening OP2, and the third opening OP3 defined in the bank 500 may correspond to the openings 120OP defined in the pixel defining film 120. For example, the first opening OP1 defined in the bank 500 may correspond to the opening 120OP of the pixel defining film 120 defining the first emission area EA1; the second opening OP2 defined in the bank 500 may correspond to the opening 120OP of the pixel defining film 120 defining the second emission area EA2; and the third opening OP3 defined in the bank 500 may correspond to the opening 120OP of the pixel defining film 120 defining the third emission area EA3. That is, that the first opening OP1 to the third opening OP3 of the bank 500 correspond to the openings 120OP of the pixel defining film 120 respectively defining the first emission area EA1 to the third emission area EA3 may indicate that, when seen in a direction (z direction) perpendicular to the top surface 600-1 of the upper substrate 600, shapes of edges of the first opening OP1 to the third opening OP3 of the bank 500 are respectively identical or similar to shapes of edges of the openings 120OP of the pixel defining film 120 respectively defining the first emission area EA1 to the third emission area EA3.

According to some embodiments, areas of the first opening OP1 to the third opening OP3 defined in the bank 500 may be greater than areas of the openings 120OP of the pixel defining film 120 respectively defining the first emission area EA1 to the third emission area EA3.

According to some embodiments, the first quantum-dot layer 561 may be arranged in the first opening OP1 defined in the bank 500; the second quantum-dot layer 563 may be arranged in the second opening OP2 defined in the bank 500; and the light-transmitting layer 565 may be arranged in the third opening OP3 defined in the bank 500. The first quantum-dot layer 561, the second quantum-dot layer 563, and the light-transmitting layer 565 may include the materials described above with reference to FIG. 3.

According to some embodiments, the first quantum-dot layer 561, the second quantum-dot layer 563, and the light-transmitting layer 565 may be respectively formed in the first opening OP1, the second opening OP2, and the third opening OP3 of the bank 500 through an inkjet printing method.

According to some embodiments, the first color filter layer 581, the second color filter layer 583, and the third color filter layer 585 may be located on the bottom surface 600-2 of the upper substrate 600. The first color filter layer 581 may be located directly on the first quantum-dot layer 561; the second color filter layer 583 may be located directly on the second quantum-dot layer 563; and the third color filter layer 585 may be located directly on the light-transmitting layer 565. Accordingly, light converted in the first quantum-dot layer 561 may be directly incident to the first color filter layer 581; light converted in the second quantum-dot layer 563 may be directly incident to the second color filter layer 583; and light transmitted through the light-transmitting layer 565 may be directly incident to the third color filter layer 585.

According to some embodiments, only light having wavelengths in different wavelength bands may pass through the first color filter layer 581, the second color filter layer 583, and the third color filter layer 585. More particularly, only light having a wavelength of a first wavelength band may pass through the first color filter layer 581; only light having a wavelength of a second wavelength band may pass through the second color filter layer 583; and only light having a wavelength of a third wavelength band may pass through the third color filter layer 585. Here, the first wavelength band may be in a range of 630 nm (or about 630 nm) to 780 nm (or about 780 nm), the second wavelength band may be in a range of 495 nm (or about 495 nm) to 570 nm (or about 570 nm), and the third wavelength band may be in a range of 450 nm (or about 450 nm) to 495 nm (or about 495 nm). That is, only the light having the wavelength in a range of 630 nm (or about 630 nm) to 780 nm (or about 780 nm) may pass through the first color filter layer 581; only the light having the wavelength in a range of 495 nm (or about 495 nm) to 570 nm (or about 570 nm) may pass through the second color filter layer 583; and only the light having the wavelength in a range of 450 nm (or about 450) nm to 495 nm (or about 495 nm) may pass through the third color filter layer 585.

According to some embodiments, the first color filter layer 581 may overlap (or at least partially overlap) the first light-emitting device OLED1 including the first pixel electrode 211. For example, the first color filter layer 581 may overlap (or at least partially overlap) the first emission area EA1 of the first light-emitting device OLED1. Accordingly, light emitted from the first light-emitting device OLED1 may pass through the first color filter layer 581. Further details thereof will be further described later.

According to some embodiments, the second color filter layer 583 may overlap (or at least partially overlap) the second light-emitting device OLED2 including the second pixel electrode 213. For example, the second color filter layer 583 may overlap (or at least partially overlap) the second emission area EA2 of the second light-emitting device OLED2. Accordingly, light emitted from the second light-emitting device OLED2 may pass through the second color filter layer 583. Further details thereof will be further described later.

According to some embodiments, the third color filter layer 585 may overlap (or at least partially overlap) the third light-emitting device OLED3 including the third pixel electrode 215. For example, the third color filter layer 585 may overlap (or at least partially overlap) the third emission area EA3 of the third light-emitting device OLED3. Accordingly, light emitted from the third light-emitting device OLED3 may pass through the third color filter layer 585. Further details thereof will be further described later.

According to some embodiments, a fourth opening OP4 and a fifth opening OP5 may be defined in the first color filter layer 581. The fourth opening OP4 defined in the first color filter layer 581 may overlap (or at least partially overlap) the second color filter layer 583, and the fifth opening OP5 defined in the first color filter layer 581 may overlap (or at least partially overlap) the third color filter layer 585.

According to some embodiments, a sixth opening OP6 and a seventh opening OP7 may be defined in the second color filter layer 583. The sixth opening OP6 defined in the second color filter layer 583 may overlap (or at least partially overlap) the first color filter layer 581, and the seventh opening OP7 defined in the second color filter layer 583 may overlap (or at least partially overlap) the third color filter layer 585.

According to some embodiments, an eighth opening OP8 and a ninth opening OP9 may be defined in the third color filter layer 585. The eighth opening OP8 defined in the third color filter layer 585 may overlap (or at least partially overlap) the first color filter layer 581, and the ninth opening OP9 defined in the third color filter layer 585 may overlap (or at least partially overlap) the second color filter layer 583.

According to some embodiments, at least a portion of the first color filter layer 581 may be exposed through the sixth opening OP6 defined in the second color filter layer 583 and the eighth opening OP8 defined in the third color filter layer 585. The first color filter layer 581 may directly contact the first quantum-dot layer 561 through the sixth opening OP6, and may directly contact the bottom surface 600-2 of the upper substrate 600 through the eighth opening OP8. That is, the first color filter layer 581 may directly contact the first quantum-dot layer 561 in a direction (e.g., the −z direction) of the bottom surface 600-2 of the upper substrate 600, and may also directly contact the bottom surface 600-2 of the upper substrate 600 in a direction (e.g., the +z direction) of the top surface 600-1 of the upper substrate 600.

Accordingly, the light having the wavelength of the first wavelength band may be emitted outward from a first pixel PX1 through the upper substrate 600. More particularly, the light of the third wavelength band emitted from the first light-emitting device OLED1 is converted into the light of the first wavelength band while passing through the first quantum-dot layer 561 and is filtered while passing through the first color filter layer 581, and therefore, the light having the wavelength of the first wavelength band may be emitted outward from the first subpixel PXa through the upper substrate 600. In addition, as the light emitted from the first light-emitting device OLED1 passes through the first quantum-dot layer 561 and the first color filter layer 581, color purity of the light emitted through the upper substrate 600 may be relatively improved.

According to some embodiments, at least a portion of the second color filter layer 583 may be exposed through the fourth opening OP4 defined in the first color filter layer 581 and the ninth opening OP9 defined in the third color filter layer 585. The second color filter layer 583 may directly contact the bottom surface 600-2 of the upper substrate 600 through the fourth opening OP4 and the ninth opening OP9. That is, the second color filter layer 583 may directly contact the second quantum-dot layer 563 in the direction (e.g., the −z direction) of the bottom surface 600-2 of the upper substrate 600, and may also directly contact the bottom surface 600-2 of the upper substrate 600 in the direction (e.g., the +direction) of the top surface 600-1 of the upper substrate 600.

Accordingly, the light having the wavelength of the second wavelength band may be emitted outward from the second subpixel PXb through the upper substrate 600. More particularly, the light of the third wavelength band emitted from the second light-emitting device OLED2 may be converted into the light of the second wavelength band while passing the second quantum-dot layer 563 and filtered while passing the second color filter layer 583, and therefore, the light having the wavelength of the second wavelength band may be emitted outward from a second pixel PX2 through the upper substrate 600. In addition, as the light emitted from the second light-emitting device OLED2 passes through the second quantum-dot layer 563 and the second color filter layer 583, the color purity of the light emitted through the upper substrate 600 may be improved.

According to some embodiments, at least a portion of the third color filter layer 585 may be exposed through the fifth opening OP5 defined in the first color filter layer 581 and the seventh opening OP7 defined in the second color filter layer 583. The third color filter layer 585 may directly contact the light-transmitting layer 565 through the fifth opening OP5 and the seventh opening OP7. That is, the third color filter layer 585 may directly contact the light-transmitting layer 565 in the direction (e.g., the −z direction) of the bottom surface 600-2 of the upper substrate 600, and may also directly contact the bottom surface 600-2 of the upper substrate 600 in the direction (e.g., the +z direction) of the top surface 600-1 of the upper substrate 600.

Accordingly, the light having the wavelength of the third wavelength band may be emitted outward from the third subpixel PXc through the upper substrate 600. More particularly, the light of the third wavelength band emitted through the third light-emitting device OLED3 passes through the light-transmitting layer 565 and is filtered while passing through the third color filter layer 585, and therefore, the light having the wavelength of the third wavelength band may be emitted from a third pixel PX3 through the upper substrate 600. In addition, as the light emitted from the third light-emitting device OLED3 passes through the light-transmitting layer 565 and the third light-emitting device OLED3, the color purity of the light emitted through the upper substrate 600 may be emitted.

According to some embodiments, at least two color filter layers may exist in an overlapping manner among the first subpixel PXa, the second subpixel PXb, and the third subpixel PXc. FIG. 6 illustrates that the first color filter layer 581, the second color filter layer 583, and the third color filter layer 585 exist among the first subpixel PXa, the second subpixel PXb, and the third subpixel PXc. The color filter layers overlapping one another may function as a black matrix. This is because, for example, when only the light having the wavelength of the first wavelength band passes through the first color filter layer 581, only the light having the wavelength of the second wavelength band passes through the second color filter layer 583, and only the light having the wavelength of the third wavelength passes through the third color filter layer 585, theoretically, light having any wavelength may not pass through the layers overlapping one another.

According to some embodiments, the first color filter layer 581, the second color filter layer 583, and the third color filter layer 585 may be arranged in an overlapping manner between the upper substrate 600 and the bank 500. As the first color filter layer 581, the second color filter layer 583, and the third color filter layer 585 are arranged in an overlapping manner between the upper substrate 600 and the bank 500, a height difference between the upper substrate 600 and the bank 500 may be constantly maintained.

According to some embodiments, a protective layer 460 and the filler 400 may be between the lower substrate 100 and the upper substrate 600. The filler 400 may be between the thin-film encapsulation layer 300 and the protective layer 460, and the protective layer 460 may be between the filler 400 and the bank 500.

According to some embodiments, the filler 400 may have a buffering function against foreign pressure and the like. The filler 400 may include an organic material, such as methyl silicon, phenyl silicon, polyimide, and the like. However, the filler 400 is not limited thereto and may also include an organic sealant, e.g., a urethane-based resin, an epoxy-based resin, an acryl-based resin, or silicon that is an inorganic sealant.

According to some embodiments, the protective layer 460 may be arranged or formed on or over the entire area of the filler 400. In addition, the protective layer 460 may cover the first quantum-dot layer 561, the second quantum-dot layer 563, and the light-transmitting layer 565. For example, as a process in which color filters and quantum dot layers are formed on the bottom surface 600-2 of the upper substrate 600 and the lower substrate 100 is bonded to the upper substrate 600 is performed, the protective layer 460 may cover the first quantum-dot layer 561, the second quantum-dot layer 563, and the light-transmitting layer 565 formed on the bottom surface 600-2 of the upper substrate 600. The protective layer 460 may protect the first quantum-dot layer 561, the second quantum-dot layer 563, and the light-transmitting layer 565.

According to some embodiments, the protective layer 460 may include a single layer or layers of a film including an organic material or inorganic material. The protective layer 460 may include a general-purpose polymer, such as benzocyclobutene (BCB), polyimide (PI), hexamethyldisiloxane (HMDSO), poly(methyl 2-methylpropenoate)

(PMMA), polystyrene (PS), a polymer derivative having a phenol-based group, an acryl-based polymer, an imide-based polymer, an arylether-based polymer, an amide-based polymer, a fluoride-based polymer, a p-xylene-based polymer, a vinylalcohol-based polymer, blends thereof, and the like. According to some embodiments, the protective layer 460 may include $SiO_x$, $SiN_x$, $SiO_xN_y$, $Al_2O_3$, $TiO_2$, $Ta_2O_5$, $HfO_2$, $ZnO_x$, or the like. Here, $ZnO_x$ may include ZnO and/or $ZnO_2$.

According to some embodiments, a column spacer 450 may be between the lower substrate 100 and the upper substrate 600. The column spacer 450 may be between the thin-film encapsulation layer 300 and the protective layer 460. The column spacer 450 may overlap (or at least partially overlap) the bank 500. In addition, the column spacer 450 may overlap (or at least partially overlap) the pixel defining film 120 located thereunder. For example, the column spacer 450 may not overlap the first emission area EA1, the second emission area EA2, and the third emission area EA3 of the first light-emitting device OLED1, the second light-emitting device OLED2, and the third light-emitting device OLED3.

According to some embodiments, the column spacer 450 may include a material identical to the material of the bank 500. However, the embodiments are not limited thereto. For example, the column spacer 450 may also include a material different from the material of the bank 500.

Referring to FIG. 5, the first opening OP1, the second opening OP2, and the third opening OP3 may be defined in the bank 500 of the display area DA. Here, the first opening OP1, the second opening OP2, and the third opening OP3 may be provided in plural. According to some embodiments, a dummy opening may be defined in the bank 500 of the display area DA.

As described above, the first quantum-dot layer 561 may be arranged in the first opening OP1, the second quantum-dot layer 563 may be arranged in the second opening OP2, and the light-transmitting layer 565 may be arranged in the third opening OP3.

Referring to FIGS. 5 and 6, the display device 1 according to the embodiments may include a first pixel row PXR1 and a second pixel row PXR2 adjacent to each other in the first direction (the x direction). The first pixels PX1, each of which are provided as a group of the plurality of subpixels (i.e., the first subpixel PXa, the second subpixel PXb, and the third subpixel PXc), are repeatedly arranged in the first pixel row PXR1 in the second direction (the y direction). The second pixels PX2, each of which are provided as a group of the plurality of subpixels (i.e., the first subpixel PXa, the second subpixel Pxb, and the third subpixel PXc), may be repeatedly arranged in the second pixel row PXR2 in the second direction (the y direction).

The second pixel row PXR2 is shifted by a first distance d1 in the second direction (the y direction) from the first pixel row PXR1. As the second pixel row PXR2 is shifted by the first distance d1 from the first pixel row PXR1, the second pixel PX2 may be shifted by the first distance d1 from the first pixel PX1.

The first distance d1 may be less than or equal to half a size of any one of the plurality of subpixels (i.e., the first subpixel PXa, the second subpixel PXb, and the third subpixel PXc) in the second direction (e.g., the y direction). Sizes of the subpixels (i.e., the first subpixel PXa, the second subpixel PXb, and the third subpixel PXc) may indicate sizes of the emission areas (the first emission area Ea1, the second emission area EA2, and the third emission area EA3) of the plurality of subpixels (i.e., the first subpixel PXa, the second subpixel PXb, and the third subpixel PXc). That is, the sizes of the plurality of subpixels (i.e., the first subpixel PXa, the second subpixel PXb, and the third subpixel PXc) may indicate sizes of the openings 120OP of the pixel defining film 120 formed in the plurality of subpixels (i.e., the first subpixel PXa, the second subpixel PXb, and the third subpixel PXc). Alternatively, sizes of the plurality of subpixels (i.e., the first subpixel PXa, the second subpixel PXb, and the third subpixel PXc) may indicate sizes of the first opening OP1, the second opening OP2, and the third opening OP3 defined in the bank 500. For brevity of explanation, a case in which sizes of the plurality of subpixels (i.e., the first subpixel PXa, the second subpixel PXb, and the third subpixel PXc) respectively indicate sizes of the first opening OP1, the second opening OP2, and the third opening OP3 will be mainly described.

For example, the first distance d1 may be less than or equal to half a size L of a first-first subpixel PXS1 provided in the first pixel PX1. Accordingly, the first-first subpixel PXS1, which is included in the first pixel PX1 and emits light of a first color, may partially overlap a second-first subpixel PXS2, which is included in the second pixel PX2 and emits light of the first color identical to that of the first-first subpixel PXS1, in the first direction (the x direction). The first-first subpixel PXS1 and the second-first subpixel PXS2 may each include any one of the first subpixel PXa, the second subpixel PXb, and the third subpixel PXc.

According to some embodiments, an arrangement of the plurality of subpixels (i.e., the first subpixel PXa, the second subpixel PXb, and the third subpixel PXc) provided in the first pixel PX1 may be identical to an arrangement of the plurality of subpixels (i.e., the first subpixel PXa, the second subpixel PXb, and the third subpixel PXc) provided in the second pixel PX2. That is, a relative distance and position relationship between the first subpixel PXa and the second subpixel PXb provided in the first pixel PX1 may be identical to a relative distance and position relationship between the first subpixel PXa and the second subpixel PXb included in the second pixel PX2. A relative distance and position relationship between the second subpixel PXb and the third subpixel PXc included in the first pixel PX1 may be identical to a relative distance and position relationship between the second subpixel PXb and the third subpixel PXc included in the second pixel PX2. A relative distance and position relationship between the first subpixel PXa and the third subpixel PXc included in the first pixel PX1 may be identical to a relative distance and position relationship between the first subpixel PXa and the third subpixel PXc included in the second pixel PX2.

According to some embodiments, the first distance d1 may be identical to a distance by which each of the plurality of subpixels (the first subpixel PXa, the second subpixel PXb, and the third subpixel PXc) included in the second pixel PX2 is shifted in the second direction (the y direction) with reference to the plurality of subpixels (i.e., the first subpixel PXa, the second subpixel PXb, and the third subpixel PXc) emitting light having a same color as the plurality of subpixels included in the second pixel PX2 and being included in the first pixel PX1. For example, the first distance d1 may be identical to a distance by which the second-first subpixel PXS2 is shifted in the second direction (the y direction) from the first-first subpixel PXS1.

That the second pixel row PXR2 is shifted by the first distance d1 from the first pixel row PXR1 may be understood as that the second pixel PX2 is shifted by the first distance d1 with reference to the first pixel PX1, and in addition, also may be understood that the second-first subpixel PXS2 is shifted by the first distance d1 from the first-first subpixel PXS1. Through the aforementioned pixel arrangements, the display device 1 according to embodiments may implement high-quality images. Details thereof will be described later with reference to FIG. 10.

Figure 7:
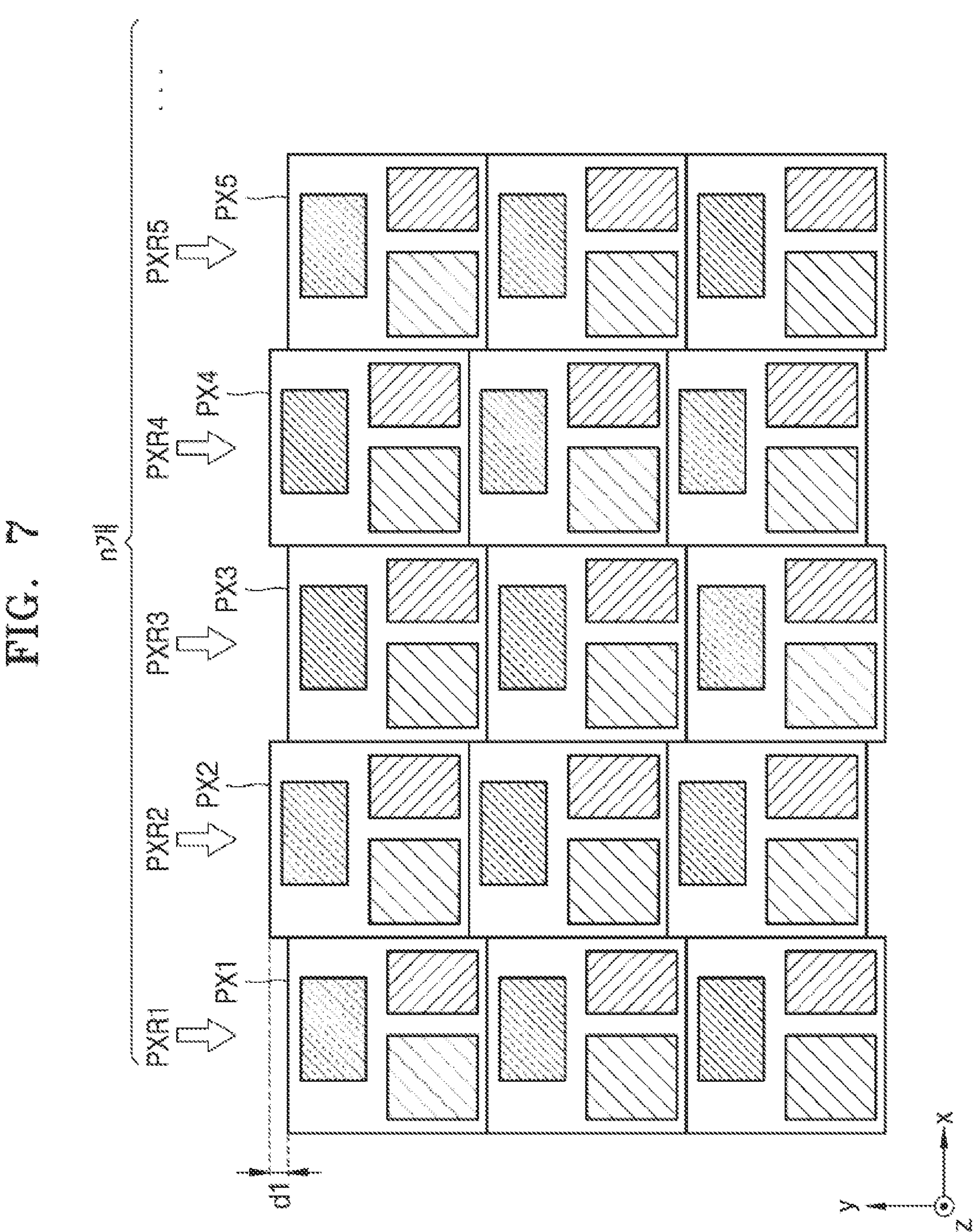
FIG. 7 is a cross-sectional view schematically illustrating a display device according to some embodiments.
Figure 8:
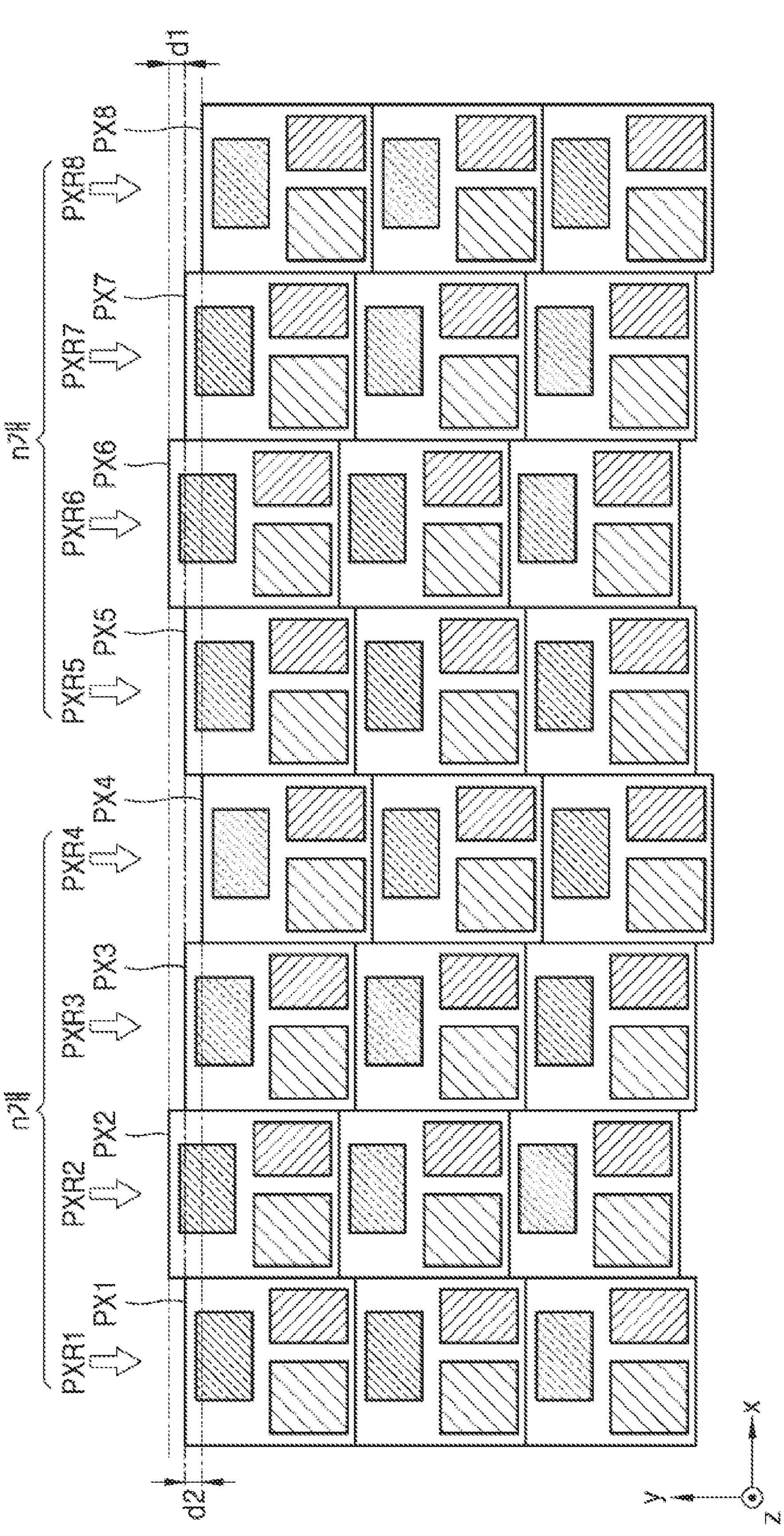
FIG. 8 is a cross-sectional view schematically illustrating a display device according to some embodiments.

FIGS. 7 and 8 are top-plan views schematically illustrating the display device 1 according to some embodiments.

Referring to FIG. 7, the display device 1 may include n (where n is a natural number equal to or greater than 2) pixel rows including the first pixel row PXR1 and the second pixel row PXR2. The n pixel rows may include the first pixel row PXR1 and the second pixel row PXR2, and may be arranged in the first direction (the x direction). The n pixel rows may each be shifted by integer times the first distance d1 in the second direction (the y direction) from the first pixel row PXR1.

Referring to FIG. 7, the n pixel rows may include the first pixel row PXR1, the second pixel row PXR2, a third pixel row PXR3, a fourth pixel row PXR4, and a fifth pixel row PXR5. FIG. 7 illustrates that the first pixel row PXR1, the second pixel row PXR2, the third pixel row PXR3, the fourth pixel row PXR4, and the fifth pixel row PXR5 are respectively shifted by zero times, one time, zero times, one time, and zero times the first distance d1 from the first pixel row PXR1. As described above, even-numbered pixel rows (i.e., the second pixel row PXR2 and the fourth pixel row PXR4) among the n pixel rows may be shifted by the first distance d1 in the second direction (the y direction) from the odd-numbered pixel rows (i.e., the first pixel row PXR1, the third pixel row PXR3, and the fifth pixel row PXR5. In this case, the n pixel rows may be arranged in a zigzag manner in the first direction (the x direction).

Referring to FIG. 8, the n pixel rows may be repeatedly arranged in the first direction. For example, FIG. 8 illustrates that the first pixel row PXR1, the second pixel row PXR2, the third pixel row PXR3, and the fourth pixel row PXR4 are respectively shifted by zero times, one time, zero times,—one time the first distance d1 from the first pixel row PXR1. Likewise, the fifth pixel row PXR5, a sixth pixel row PXR6, a seventh pixel row PXR7, and an eighth pixel row PXR8 may be respectively shifted by zero times, one time, zero times, and—one time the first distance d1 from the first pixel row PXR1. That is, four pixel rows may be repeatedly arranged at a cycle of $\{0, 1, 0, -1\}$ in the first direction (the x direction). Unlike in the example shown in FIG. 8, five or more pixel rows may be repeatedly arranged in the first direction (the x direction). As the n pixel rows are repeatedly arranged in the first direction, difficulty in a process of manufacturing the display device 1 may be reduced. Details thereof will be described later with reference to FIG. 10.

Figure 9:
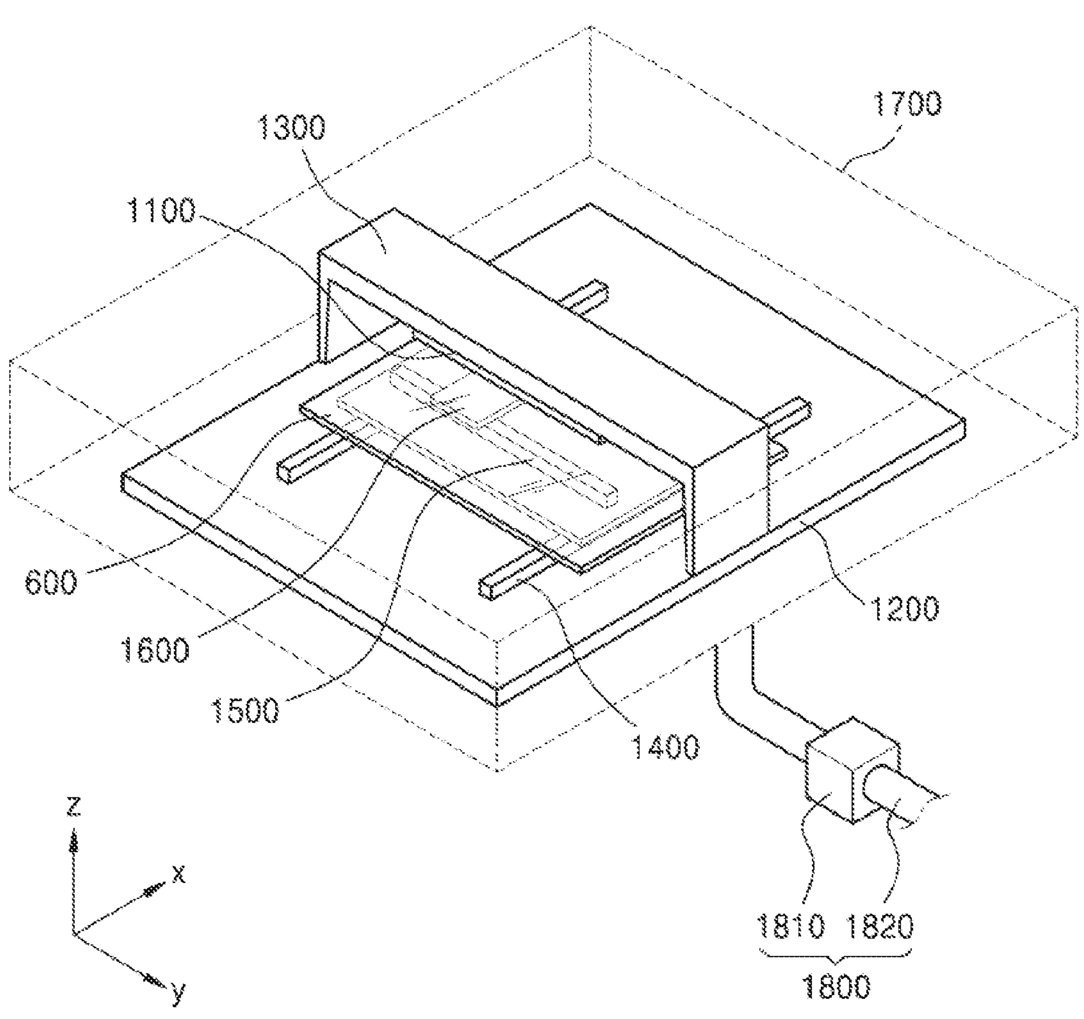
FIG. 9 is a cross-sectional view schematically illustrating a display device according to some embodiments.
Figure 10:
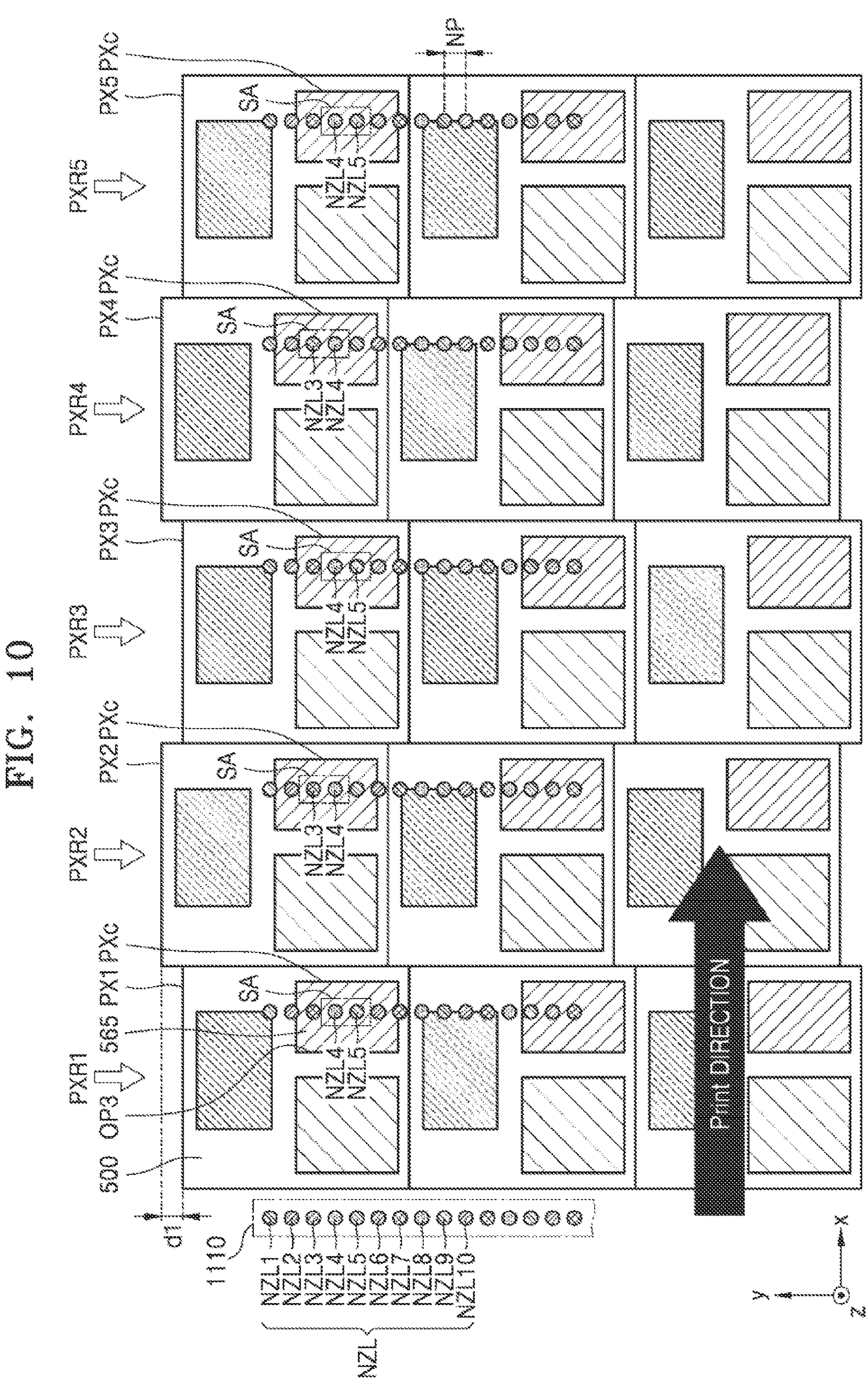
FIG. 10 is a top-plan view schematically illustrating a method of manufacturing a display device, according to some embodiments.
Figure 11:
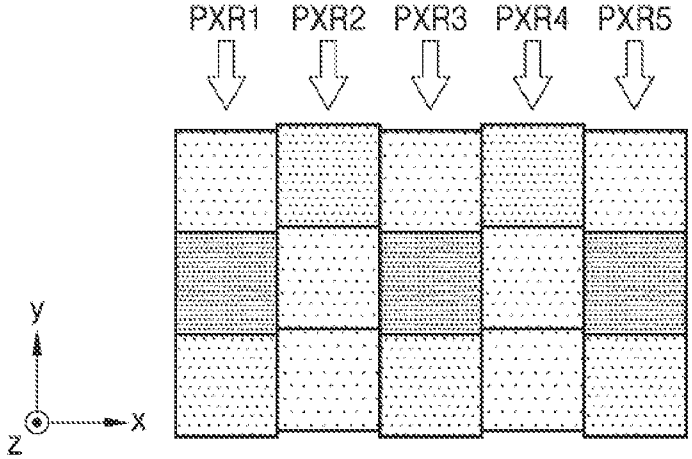
FIG. 11 is a top-plan view for describing a display device according to some embodiments.
Figure 12A:
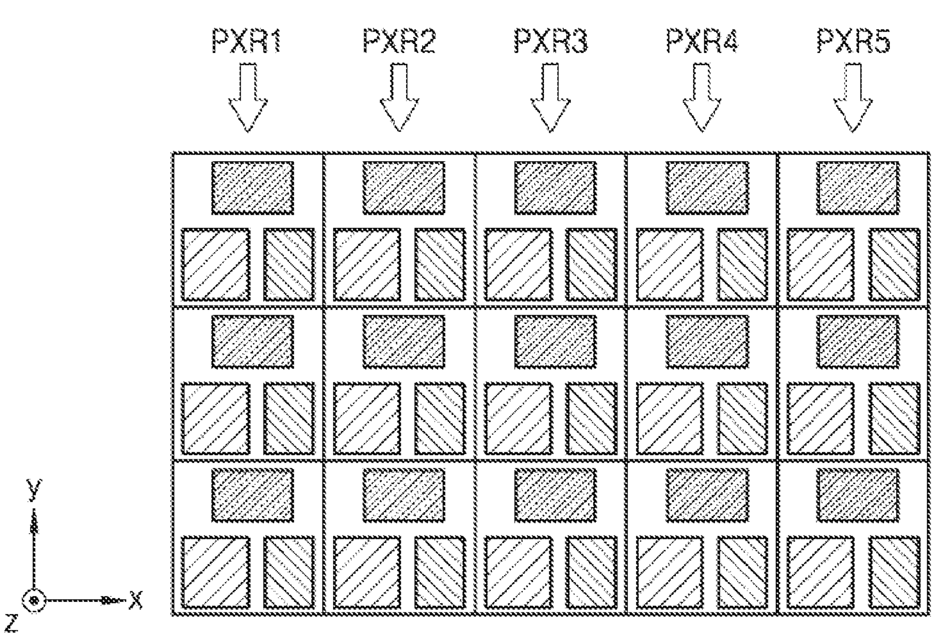
FIG. 12A is a top-plan view schematically illustrating a display device according to a Comparative Example.
Figure 12B:
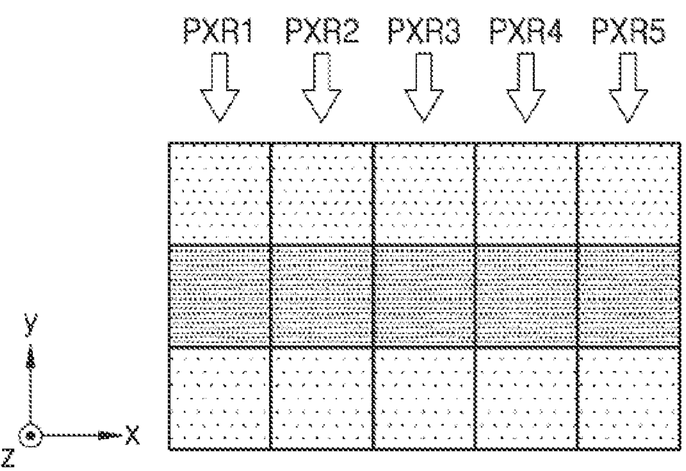
FIG. 12B is a top-plan view for describing a display device according to a Comparative Example.

FIG. 9 is a cross-sectional view schematically illustrating a manufacturing device 1000 for the display device 1, and FIG. 10 is a top-plan view schematically illustrating a method of manufacturing the display device 1 according to some embodiments. FIG. 11 is a top-plan view illustrating luminance of the third subpixel PXc included in each pixel shown in FIG. 10, according to positions. FIG. 12A is a top-plan view schematically illustrating a display device according to a Comparative Example; and FIG. 12B is a top-plan view of the luminance of the third subpixel PXc included in each pixel, according to positions.

Referring to FIG. 9, the manufacturing device 1000 for the display device 1 may include a discharger 1100, a body 1200, a supporter 1300, a first driver 1400, a second driver 1500, and a stage 1600.

The discharger 1100 may include a plurality of head portions 1110. In addition, the plurality of head portions 1110 may each include at least one nozzle NZL. Here, a plurality of the nozzles NZL may be arranged in a row or a zigzag manner. Hereinafter, for convenience of explanation, a case in which the plurality of nozzles NZL are arranged in a row will be mainly described in detail.

The plurality of nozzles NZL arranged in the head portion 1110 described above may be arranged apart from one another in the second direction.

The body 1200 may be formed in various types and may be located on ground, a surface of another craft machine, a bottom surface of a building, and the like. For example, the body 1200 may have the form of a plate. According to some embodiments, the body 1200 may also have the form of a table in which a plurality of frames are connected to one another. According to some embodiments, the body 1200 may have a shape in which a plurality of frames and a plurality of plates are arranged in the form of a box. Here, the body 1200 is not limited thereto, and may include any structure by which a structure arranged thereon and the like may be supported.

The supporter 1300 may be connected to the body 1200 and support the discharger 1100. According to some embodiments, the supporter 1300 may be fixed to the body 1200. According to some embodiments, the supporter 1300 may be located on the body 1200 in a linear-movable manner. In this case, a driver such as a gantry may be located between the supporter 1300 and the body 1200, and the supporter 1300 may perform linear movement on the gantry. However, for convenience of explanation, a case in which the supporter 1300 is fixed to the body 1200 will be mainly described in more detail.

The discharger 1100 may be fixed onto the supporter 1300 described above. According to some embodiments, the discharger 1100 may be located under the supporter 1300 in a linear-movable manner. In this case, a cylinder, a linear motor, a motor, a ball screw, a motor, and a rack gear may be arranged in at least one of the discharger 1100 or the supporter 1300, such that the discharger 1100 may perform linear movement in the first direction (e.g., the x direction shown in FIG. 9). Hereinafter, for convenience of explanation, the case in which the discharger 1100 is fixed onto the supporter 1300 will be mainly described.

The first driver 1400 may be located between the body 1200 and the stage 1600. Here, the first driver 1400 may have the stage 1600 to perform linear movement in the first direction. In this case, the first driver 1400 may have various shapes. According to some embodiments, the first driver 1400 may include a cylinder being fixed to the body 1200 and including a shaft connected to the second driver 1500. According to some embodiments, the first driver 1400 may include a motor fixed to the body 1200 and a ball screw connected to the motor and the second driver 1500. According to some embodiments, the first driver 1400 may also include a linear motor connected to the second driver 1500. However, the first driver 1400 is not limited thereto and may include any structures and devices connected to the second driver 1500 and configured to have the stage 1600 perform linear movement in the first direction.

The second driver 1500 may be located above the first driver 1400. In this case, the second driver 1500 may have the stage 1600 perform linear movement in the second direction (e.g., the y direction shown in FIG. 9). In the aforementioned case, the second driver 1500 may have a form similar to that of the first driver 1400. Hereinafter, for convenience of explanation, a case in which the first driver 1400 and the second driver 1500 each includes a linear motor will be mainly described.

The stage 1600 may be connected to the second driver 1500, and may perform linear movement in at least one of the first direction or the second direction according to operation of the first driver 1400 and the second driver 1500. Here, the stage 1600 may be set on the upper substrate 600. In this case, when the stage 1600 performs linear movement in at least one of the first direction or the second direction, the upper substrate 600 may also perform linear movement in at least one of the first direction or the second direction.

A space may be formed in a chamber 1700, and the discharger 1100, the body 1200, the supporter 1300, the first driver 1400, the second driver 1500, and the stage 1600 may be arranged in the chamber 1700. Here, the chamber 1700 may include an open portion, and a gate valve and the like may be arranged in the open portion of the chamber 1700 to open and close the open portion of the chamber 1700.

A pressure adjuster 1800 may be connected to the chamber 1700. The pressure adjuster 1800 may include a pipe 1810 and a pump 1820 arranged in the pipe 1810. In this case, the pump 1820 may discharge a gas in the chamber 1700 outside, or may introduce the gas outside into the chamber 1700.

The manufacturing device for the display device may form quantum-dot layers and a light-transmitting layer by providing droplets to the upper substrate 600. According to some embodiments, the manufacturing device for the display device may form an emission layer on the lower substrate 100 by providing droplets to the lower substrate 100.

For brevity of explanation, an example in which the light-transmitting layer 565 is formed by discharging the droplets to the third opening OP3 of the bank 500, which correspond to the emission area of the third subpixel PXc, will be described.

Referring to FIG. 10, the plurality of nozzles NZL arranged in the head portion 1110 may be arranged apart from one another in the second direction. The plurality of nozzles may be arranged apart from one another in a uniform nozzle distance NP.

The plurality of nozzles NZL may sequentially provide the droplets to the discharge area SA of the third subpixel PXc arranged in each of the first pixel PX1, the second pixel PX2, the third pixel PX3, the fourth pixel PX4, and the fifth pixel PX5 in the first direction (the x direction).

In general, when the third subpixel PXc is formed in a small size to implement a high-resolution image, the number of nozzles used to provide the droplets decrease. In addition, as the plurality of nozzles NZL do not accurately discharge the droplets, the droplets are provided only in the discharge area SA corresponding to a center portion of the third opening OP3 to secure margin, not to the entire area of the third opening OP3 of the bank 500, and therefore, the number of nozzles used for one third subpixel PXc further decreases.

When the plurality of pixel rows (i.e., the first pixel row PXR1, the second pixel row PXR2) are arranged as shown in FIG. 12A without being shifted from one another in the second direction (the y direction), unlike in the embodiments, the third subpixels PXc aligned in the first direction (the x direction) will be receive the droplets from the same nozzles NZL. That is, the third subpixels PXc aligned in a same column may receive the droplets having a same volume from the same nozzles NZL. As the volume of the droplets have influence on a luminance of corresponding pixels, the third subpixels PXc aligned in a same column have a same luminance.

In addition, as it is difficult for the plurality of nozzles NZL to provide the droplets having a precisely same amount, different amounts of the droplets may be provided to the columns. That is, as the luminance of the third subpixels Pxc arranged in a same column is identical and the columns respectively have different luminances, horizontal lines may be acknowledge on the display device, thus causing degradation in display quality.

Referring to FIG. 10, according to some embodiments, the second pixel row PXR2 may be shifted in the second direction (the y direction) by the first distance d1 compared with the first pixel row PXR1. The first distance d1 may be smaller than or equal to half a size of the third subpixel PXc. The first distance d1 may indicate a distance in which the third subpixel PXc included in the second pixel PX2 is shifted in the second direction (the y direction) compared with the third subpixel PXc included in the first pixel PX1.

As the second pixel row PXR2 is aligned with shift in the second direction (the y direction) compared with the first pixel row PXR1, a nozzle NZL used to discharge the droplets to the third subpixel PXc of the first pixel PX1 may be different from a nozzle used to discharge the droplets to the third subpixel PXc of the second pixel PX2.

For example, as shown in FIG. 10, a fourth nozzle NZL4 and a fifth nozzle NZL5 may be used in the third pixel PXc of the first pixel PX1, on the other hand, a third nozzle NZL3 and the fourth nozzle NZL4 may be used in the third pixel PXc of the second pixel PX2. That is, even to the third subpixels PXc arranged in a same column, the droplets may be applied using partially or totally different nozzles. Even when the third nozzle NZL3 discharged more droplets than those of other nozzles due to manufacturing error, the third nozzle NZL3 is used in only some of the third subpixels PXc arranged in the same column, and therefore, as shown in FIG. 11, the horizontal lines may decrease visibility. FIG. 11 is a top-plan view illustrating luminance of the third subpixel PXc included in each pixel shown in FIG. 10, according to positions.

When the pixel rows are arranged without shift as in the Comparative Example shown in FIG. 12A described above, as shown in FIG. 12B, a horizontal line due to errors of the nozzles may be acknowledged. FIG. 12B is a top-plan view illustrating luminance of the third subpixel PXc included in each pixel shown in FIG. 12A, according to positions.

Referring again to FIG. 10, when the first distance d1 is arbitrarily set independent from the nozzle distance, the number of nozzles NZL may vary according to pixel rows corresponding to the discharge area SA. According to some embodiments, the first distance d1 may be provided by interval times the nozzle distance NP. Accordingly, the number of nozzles NZL used in all pixel rows may be constantly maintained.

That is, by constantly maintaining the number of nozzles NZL and variously using the nozzles (hereinafter, mixing the nozzles) even in the pixels arranged in the same row, concentration of the pixels having the same luminance may be prevented or reduced.

As the second pixel row PXR2 is shifted in the second direction (the y direction) by the first distance d1 from the first pixel row PXR1, the display device according to some embodiments may implement high-quality images even at a high resolution. In addition, in a the method of manufacturing the display device according to some embodiments, may manufacture a display device configured to implement high-quality images even at a high resolution by providing the droplets to the first opening OP1, the second opening OP2, and the third opening OP3 of the bank 500 arranged the certain pixel arrangement described above.

The display device may provide droplets to discharge areas with more security than in a case where the plurality of nozzles NZL are vibrated in the second direction (the y direction) and mixed with one another. In addition, as the pixel rows may be repeated at a constant cycle, operations for processes may be more convenient than a case in which the substrate is tilted to mix the nozzles.

According to some embodiments implemented as described above, implemented are a display device configured to implement high-quality images even at a high resolution as the pixel rows are shifted by a certain distance, and a method of manufacturing the display device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising a plurality of pixels and configured to display images, wherein the plurality of pixels comprise a first pixel row and a second pixel row adjacent to each other along a first direction, a first pixel, comprising a first group of a first plurality of subpixels, is repeatedly arranged along the first pixel row in a second direction perpendicular to the first direction, the second pixel row is shifted by a first distance in the second direction from the first pixel row, and the first distance is less than or equal to half a size of any one of the first plurality of sub pixels in the second direction.

2. The display device of claim 1, wherein a second pixel, comprising a second group of a second plurality of subpixels, is repeatedly arranged in the second direction in the second pixel row, and an arrangement of the first plurality of subpixels of the first pixel is identical to an arrangement of the second plurality of subpixels of the second pixel.

3. The display device of claim 2, wherein a 1-1 subpixel configured to emit a first color among the first plurality of subpixels of the first pixel partially overlaps, in the first direction, a 2-1 subpixel configured to emit the first color among the second plurality of subpixels of the second pixel.

4. The display device of claim 3, wherein the 2-1 subpixel is shifted by the first distance in the second direction from the 1-1 subpixel.

5. The display device of claim 1, wherein the plurality of pixels comprise n pixel rows (where n is a natural number equal to or greater than 2) comprising the first pixel row and the second pixel row and arranged along the first direction, and each of the n pixel rows are shifted by an integer times the first distance in the second direction from the first pixel row.

6. The display device of claim 5, wherein the n pixel rows are repeatedly arranged along the first direction.

7. The display device of claim 5, wherein even-numbered pixel rows among the n pixel rows are shifted by the first distance in the second direction from odd-numbered pixel rows.

8. The display device of claim 1, wherein the display device comprises an emission panel and a color panel, and the color panel comprises a bank, in which an opening corresponding to an emission area of the plurality of pixels is provided, and a quantum dot layer filling the opening of the bank.

9. The display device of claim 8, wherein the emission panel comprises a pixel electrode, a pixel defining film in which an opening exposing a portion of the pixel electrode and corresponding to the emission area of the plurality of pixels is provided, and an emission area filling the opening of the pixel defining film.

10. A method of manufacturing a display device comprising an emission panel and a color panel, the method comprising:

forming a bank, in which an opening is formed, in a certain pixel arrangement on a substrate; and providing droplets on the substrate on which the bank is formed, and the pixel arrangement comprises a first pixel row and a second pixel row adjacent to each other in a first direction, wherein a first pixel, comprising a first group of a first plurality of subpixels, is repeatedly arranged in the first pixel row along a second direction perpendicular to the first direction, the second pixel row is shifted by a first distance in the second direction from the first pixel row, and the first distance is less than or equal to half a size of any one of the plurality of subpixels in the second direction.

11. The method of claim 10, wherein second pixels, each comprising a second group of a second plurality of subpixels, are repeatedly arranged along the second direction in the second pixel row, and an arrangement of the first plurality of subpixels of the first pixel is identical to an arrangement of the second plurality of subpixels of the second pixel.

12. The method of claim 11, wherein a 1-1 subpixel configured to emit a first color among the first plurality of subpixels provided in the first pixel partially overlaps, in the first direction, a 2-1 subpixel configured to emit the first color among the second plurality of subpixels provided in the second pixel.

13. The method of claim 12, wherein the 2-1 subpixel is shifted by the first distance in the second direction from the 1-1 subpixel.

14. The method of claim 12, wherein the providing of the droplets on the substrate on which the bank is formed comprises discharging the droplets into the opening of the bank according to the pixel arrangement through a plurality of nozzles while moving the substrate in the first direction.

15. The method of claim 14, wherein the first distance is an integer times an interval among the plurality of nozzles.

16. The method of claim 14, wherein, among the plurality of nozzles, nozzles configured to discharge the droplets to the 1-1 subpixel are at least partially different from nozzles configured to discharge the droplets to the 2-1 subpixel.

17. The method of claim 10, wherein the pixel arrangement comprises n pixel rows (where n is a natural number equal to or greater than 2) comprising the first pixel row and the second pixel row and arranged in the first direction, and each of the n pixel rows is shifted by an integer times the first distance in the second direction from the first pixel row.

18. The method of claim 17, wherein, in the pixel arrangement, the n pixel rows are repeatedly arranged along the first direction.

19. The method of claim 17, wherein, in the pixel arrangement, even-numbered pixel rows among the n pixel rows are shifted by the first distance in the second direction from odd-numbered pixel rows.

20. The method of claim 10, further comprising arranging the color panel on the emission panel.

* * * * *